(12) United States Patent
Cox et al.

(10) Patent No.: US 10,482,947 B2
(45) Date of Patent: Nov. 19, 2019

(54) INTEGRATED ERROR CHECKING AND CORRECTION (ECC) IN BYTE MODE MEMORY DEVICES

(71) Applicant: Intel Corporation, Santa Clara, CA (US)

(72) Inventors: Christopher E. Cox, Placerville, CA (US); Uksong Kang, Hillsboro, OR (US); Nagi Aboulenein, King City, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/911,068

(22) Filed: Mar. 2, 2018

(65) Prior Publication Data

US 2018/0254079 A1    Sep. 6, 2018

Related U.S. Application Data

(60) Provisional application No. 62/465,837, filed on Mar. 2, 2017.

(51) Int. Cl.
*G06F 3/06* (2006.01)
*G06F 11/10* (2006.01)
(Continued)

(52) U.S. Cl.
CPC .......... *G11C 11/408* (2013.01); *G06F 3/0604* (2013.01); *G06F 3/0659* (2013.01);
(Continued)

(58) Field of Classification Search
CPC .... G06F 3/0604; G06F 3/0659; G06F 3/0673; G06F 11/1048; G06F 11/1068; G11C 11/408; G11C 29/52
See application file for complete search history.

(56) References Cited

U.S. PATENT DOCUMENTS 7,386,765 B2    6/2008  Ellis et al.
7,620,875 B1    11/2009 Nelson et al.
(Continued)

OTHER PUBLICATIONS

Extended European Search Report for Patent Application No. EP18157970.7, dated Jul. 3, 2018, 6 pages.

*Primary Examiner* — Aracelis Ruiz
(74) *Attorney, Agent, or Firm* — Compass IP Law PC

(57) ABSTRACT

A multi-die memory device having fixed bandwidth interfaces can selectively connect portions of the interfaces of the multiple memory dies as a memory channel for the multi-die device. The selective application of the interface bits of the memory dies enables the application of ECC (error checking and correction) in memory devices that otherwise have insufficient connectors to exchange ECC information. The device includes circuitry to selectively apply CAS (column address select) signals to the memory dies to selectively connect the connectors of the memory dies. CAS selection can provide various configurations in which selected bits of a first memory die interface are combined with selected bit or bits of a second memory die interface to provide the device interface. The memory dies can operate in byte mode to apply only half of their data I/O (input/output) interface, with CAS doubled up to provide access to the memory arrays.

21 Claims, 16 Drawing Sheets

(51) Int. Cl.
  *G11C 11/408* (2006.01)
  *G11C 29/52* (2006.01)
(52) U.S. Cl.
  CPC ........ *G06F 3/0673* (2013.01); *G06F 11/1048* (2013.01); *G06F 11/1068* (2013.01); *G11C 29/52* (2013.01)

(56) References Cited

U.S. PATENT DOCUMENTS

| | | |
|---|---|---|
| 9,317,464 B2 | 4/2016 | Cox et al. |
| 9,817,714 B2 | 11/2017 | Halbert et al. |
| 9,870,325 B2 | 1/2018 | Bains |
| 2008/0294841 A1* | 11/2008 | Carnevale ........... G06F 11/1044 711/105 |
| 2009/0055714 A1* | 2/2009 | Bains ..................... G11C 5/025 714/764 |
| 2009/0235113 A1* | 9/2009 | Shaeffer .............. G06F 11/1004 714/5.11 |
| 2012/0182821 A1 | 7/2012 | Perego |
| 2015/0234726 A1 | 8/2015 | Moran et al. |
| 2016/0092383 A1 | 3/2016 | Bains et al. |
| 2016/0196181 A1 | 7/2016 | Troia |
| 2017/0004035 A1 | 1/2017 | Suh et al. |
| 2017/0123897 A1 | 5/2017 | Quach et al. |
| 2017/0199830 A1 | 7/2017 | Nale et al. |
| 2018/0060194 A1 | 3/2018 | Ryu et al. |
| 2018/0095821 A1 | 4/2018 | Vogt |
| 2018/0130506 A1 | 5/2018 | Kang et al. |
| 2018/0137005 A1 | 5/2018 | Wu et al. |
| 2018/0210787 A1 | 7/2018 | Bains et al. |

* cited by examiner

INTEGRATED ERROR CHECKING AND CORRECTION (ECC) IN BYTE MODE MEMORY DEVICES

PRIORITY

The present application is a nonprovisional application based on U.S. Provisional Application No. 62/465,837 filed Mar. 2, 2017, and claims the benefit of priority of that application. The provisional application is hereby incorporated by reference.

FIELD

Descriptions are generally related to computer memory systems, and more particular descriptions are related to integration of error checking and correction in memory devices capable of byte mode operation.

BACKGROUND

Almost any variety of electronic device, including servers, desktop or laptop computers, mobile devices, or consumer and business electronics, utilize memory resources to store and manage data and code for execution by processing resources. Memory device fabrication process feature geometries continue to shrink, which causes memory densities to continue to increase. However, scaling to higher densities is likely to increase the number of errors in memory devices. One technique for addressing memory errors is to employ ECC (error checking and correction, also referred to as error correction coding). Traditionally a memory controller performs error detection and correction.

However, the use of ECC typically requires exchanging more data bits, which can require a bus width increase and a corresponding change to a memory device data interface. Low power memory devices typically have a x16 interface, or a data bus interface with 16 connectors and corresponding 16 internal data paths. The application of ECC with low power memory devices has thus traditionally involved adding a second device, or adding nearly double the system memory to allow for ECC. While wasteful of the resources, doubling the number of memory devices was traditionally the only practical option, seeing that implementing interface changes to low power memory for purposes of ECC would require significant redesigns to the I/O (input/output) interface of the memory and significant internal redesigns to provide signal lines for the exchange of ECC information.

Thus, for systems where ECC was considered necessary, non-low power memory has traditionally been used. However, there are operating conditions, such as high temperature environments, where low power memory performs better than standard commodity memory. In such systems, low power memory devices were used, and to enable implementing ECC, the system would be deployed with number of devices needed.

BRIEF DESCRIPTION OF THE DRAWINGS

The following description includes discussion of figures having illustrations given by way of example of implementations of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one example" or "in an alternate implementation" appearing herein describe various examples and implementations of the invention, and do not necessarily all refer to the same example. However, they are also not necessarily mutually exclusive.

Figure 1:
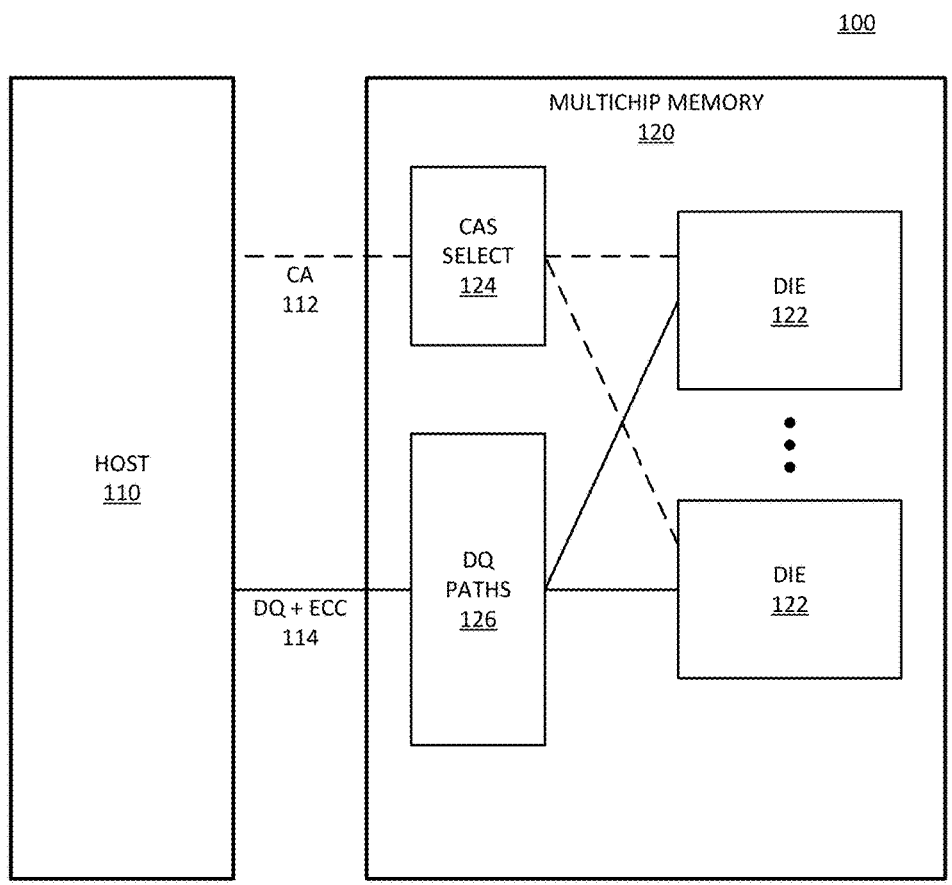
FIG. 1 is a block diagram of an example of a system to apply ECC to a multichip memory with a fixed channel width without traditional ECC bit allocation.

Descriptions of certain details and implementations follow, including a description of the figures, which may depict some or all of the examples described below, as well as discussing other potential examples or implementations of the inventive concepts presented herein.

DETAILED DESCRIPTION

As described herein, a memory device can be operated in byte mode to enable the use of one or more I/O (input/output) signal lines to implement ECC (error checking and correction) in a system with a fixed channel width to the memory device. There are various configurations in which byte mode can enable using different portions of the memory device to enable ECC in a memory device with a typically fixed channel width and I/O interface size (e.g., x16). While byte mode is referenced, it will be understood that similar techniques can be used to enable a memory device to interface with a bus of smaller width than an internal bandwidth, to utilize a portion of the bandwidth for data and a portion for ECC.

In general, the device includes circuitry to selectively apply CAS (column address select) signals to the memory dies to selectively connect the connectors of the memory dies. CAS selection can provide various configurations in which selected bits of a first memory die interface are combined with selected bit or bits of a second memory die interface to provide the device interface. The memory dies can operate in byte mode to apply only half of their data I/O (input/output) interface, with CAS doubled up to provide access to the memory arrays.

Specific system implementations of memory devices with fixed interfaces can implement ECC by computing and storing ECC information on-die, and exchanging the ECC bits with the host (which can include the memory controller). Reference to a fixed interface can indicate an interface of a memory device that supports an expected data bandwidth, such as having a number of data (DQ) signal lines or signal line interfaces to support a desired bandwidth. Typically the data bandwidth is provided as a power of two (e.g., $2^N$ data bits, where N is an integer). The fixed interface does not include signal lines or signal line interfaces for ECC. Thus, for example, the memory device could have a binary or power of two number of signal line interfaces, but does not have additional signal line interfaces for a signal line for ECC data bits. As a specific example, other commodity memory devices may have 5 signal line interfaces, with 4 for data and 1 for ECC, or 9 signal line interfaces with 8 for data and 1 for ECC. In a fixed interface system, the 5th or the 9th bit of the commodity memory device mentioned would not be available on a device. Thus, traditional approaches involved adding an extra device to couple to a wider memory channel, and the additional device would connect, for example, only a single signal line for ECC.

In applications involving automotive and certain IOT (Internet of Things) gateway devices, the systems tend to use low power (LP) memory devices because of power consumption and heat tolerance capabilities. However, traditional LP memory devices, such as LPDDR2 (low power double data rate version 2), LPDDR3 (low power double data rate version 3), and LPDDR4 (low power double data rate version 4) have x16 interfaces, which do not allow the exchange of ECC bits without adding another device. The exchange of ECC bits does not work because there are not signal lines available for ECC information when a binary number of data bits are exchanged. Emerging byte mode operation enables an LPDDR memory device or other device to operate as two separate portions, such as two independent x8 interfaces.

Current applications of ECC with LPDDR devices require either very bandwidth intensive software alternatives or the use of an additional x16 DRAM die per channel, seeing that the channel width is also just x16. The software alternatives add overhead and latency, and the use of an additional x16 DRAM per channel results in a 100% overhead cost increase.

Extending the byte mode operation can enable the implementation of ECC with LPDDR devices. With byte mode, it is possible for a DRAM device to multiplex the DQs or data signals of two memory dies down from x16 to only x8 per die, and then tie two x8 interfaces together at a package level to form a x16 channel. In such a configuration, the command and address (C/A) lines go to both dies, but the DQs of each byte can be selected from different dies. With the implementation of ECC as described herein, the x8 interface becomes x9. In accordance with what is described herein, the column select configuration can be changed to repurpose some of the memory array as ECC bits.

The internal DQ (data) paths within the memory device enable exchanging data between the memory core or memory arrays and the external I/O or outward facing connectors. An LPDDR device can enable ECC based in byte mode with minimal internal changes to the memory devices through remapping or changing the selection of internal DQs, or both.

FIG. 1 is a block diagram of an example of a system to apply ECC to a multichip memory with a fixed channel width without traditional ECC bit allocation. System 100 includes host 110 coupled to multichip memory 120. Host 110 represents control for system 100, and can be or include a processor or central processing system. Host 110 can include a memory controller to manage access to multichip memory 120. System 100 can be any type of computing system, or in-vehicle control system or entertainment system. System 100 can be a sensor system or other type of system that includes processing hardware and memory.

Host 110 and multichip memory 120 are interconnected through one or more system buses, such as a command and address (CA) bus 112 and data (DQ) bus 114. As described herein, DQ bus 114 includes data bits for user data and also ECC bits for error checking and correction operations to improve reliability of data transfer. CA bus 112 enables host 110 to provide commands and address information to cause the memory devices to perform memory access operations, such as read, write, refresh, or other operations associated with access transactions. An access transaction can include multiple commands and multiple operations. Typically a read and a write occur over multiple cycles or unit intervals (UIs), which provide a burst of consecutive signal transfers over the data bus in response to a command or command sequence. Host 110 can multichip memory 120 can be connected through other buses or connections not explicitly illustrated.

Multichip memory 120 provides a memory package that includes multiple memory dies 122. Memory die 122 can include two or more memory chips. Each die can support one or more channels, referring to combinations of signal lines for CA bus and corresponding DQ bus. DQ paths 126 represent data paths from the packaging of multichip memory 120 to memory dies 122. DQ paths 126 can be or include external packaging interface hardware such as a connector, ball, or pin, and an electrical pathway to a corresponding pin or pad of memory dies 122. In one example, the signal lines for DQ and ECC on DQ bus 114 are routed in a way that selected lines connect to selected I/O (input/output) data pins of memory dies 122. In one example, DQ paths 126 can be global I/O paths, and a path can be shared among multiple I/O interfaces of memory dies 122. For example, the same DQ path 126 can be routed to an I/O interface of two separate memory dies 122. The path can then be switched or selected between the two memory dies 122 to enable sharing of the communication pathway in time based on switching between which device accesses it at what time.

In one example, multichip memory 120 includes CAS select 124 to select the application of a column address select (CAS) signal to different memory dies 122. In one example, a selected one of the CA bus signal lines or a selected few of the CA bus signal lines provides CAS to trigger the reading or writing of data. In current memory device architectures, the communication speeds on CA bus 112 are faster than the required latency to read (e.g., fetch and latch) data, or write (e.g., store) data to the memory arrays. While the memory array is busy performing a function, the sections of the array that share control or access hardware are locked from processing a separate access transaction. Thus, for example, typically a consecutive read to the same data array would have to wait for processing. Current architectures provide separation in the access hardware, and host 110 will provide generally provide consecutive access to separate sections, such as consecutive read transactions to two separate banks.

In system 100, CAS select 124 provides the ability within multichip memory 120 to select among multiple different CAS signals to cause memory dies 122 to access different portions of their memory arrays. Thus, in one example, memory dies 122 can operate in byte mode and be selected to access different portions of their memory arrays through the same DQ I/O interfaces. In byte mode, memory dies 122 restrict access to only selected ones of their I/O ports (e.g., 8 DQ pins instead of 16 DQ pins on the die). But with CAS selection, the memory die can apply the memory transaction to a different portion of the memory array, resulting in using more of the memory array. Otherwise, for example, certain I/O would not ever be used, and much of the memory array would be unused.

In one example, memory dies 122 have a native N-bit interface (e.g., x16 memory devices with 16-bit data bus interface). A channel width for DQ bus 114 is also N bits wide, and therefore includes N signal lines for the channel. Thus, multichip memory 120 can include an N-bit interface. In an example where multichip memory 120 includes two memory dies 122, both dies can apply only N/2 bits of their DQ interface (e.g., 8 bits each), with the two (N/2)-bit interfaces combined in multichip memory 120 into an N-bit DQ channel, where the N-bit channel may apply fewer than the full N bits (e.g., only N/2 bits) for data, and at least one bit for ECC. For example, multichip memory 120 can have a 16-bit DQ interface, with 8 bits for data and 1 bit for ECC. In any configuration, if memory dies 122 operate in a byte mode configuration or equivalent, they will transfer all prefetch data for read or all write data for write to have access to the entire memory array through N/2 bits instead of the full N bits. In one example, multichip memory 120 represents a memory package to contain two low power double data rate (LPDDR) memory chips or memory dies 122. The memory dies or memory chips can be referred to as DRAM (dynamic random access memory) devices or dies. Multichip memory 120 includes circuitry or logic to enable the selection of CAS application to the two LPDDR dies.

In various configurations, multichip memory 120 can include selection logic such as CAS select 124 or DQ path selection for DQ paths 126, or both. In one example, multichip memory 120 uses one of two memory dies 122 for DQ and the other for a single signal line for ECC. In one example, multichip memory 120 can alternate between either of two memory dies 122 for DQ and another signal line for ECC. Such configurations can enable more complete use of the memory space of memory dies 122. In one example with x16 interfaces, system 100 can use 9 bits at a time or 9 bits per transaction, but selectively apply CAS to use more of the memory dies than possible if one device is for DQ and the other for ECC. Various examples are provided in more detail below.

Figure 2A:
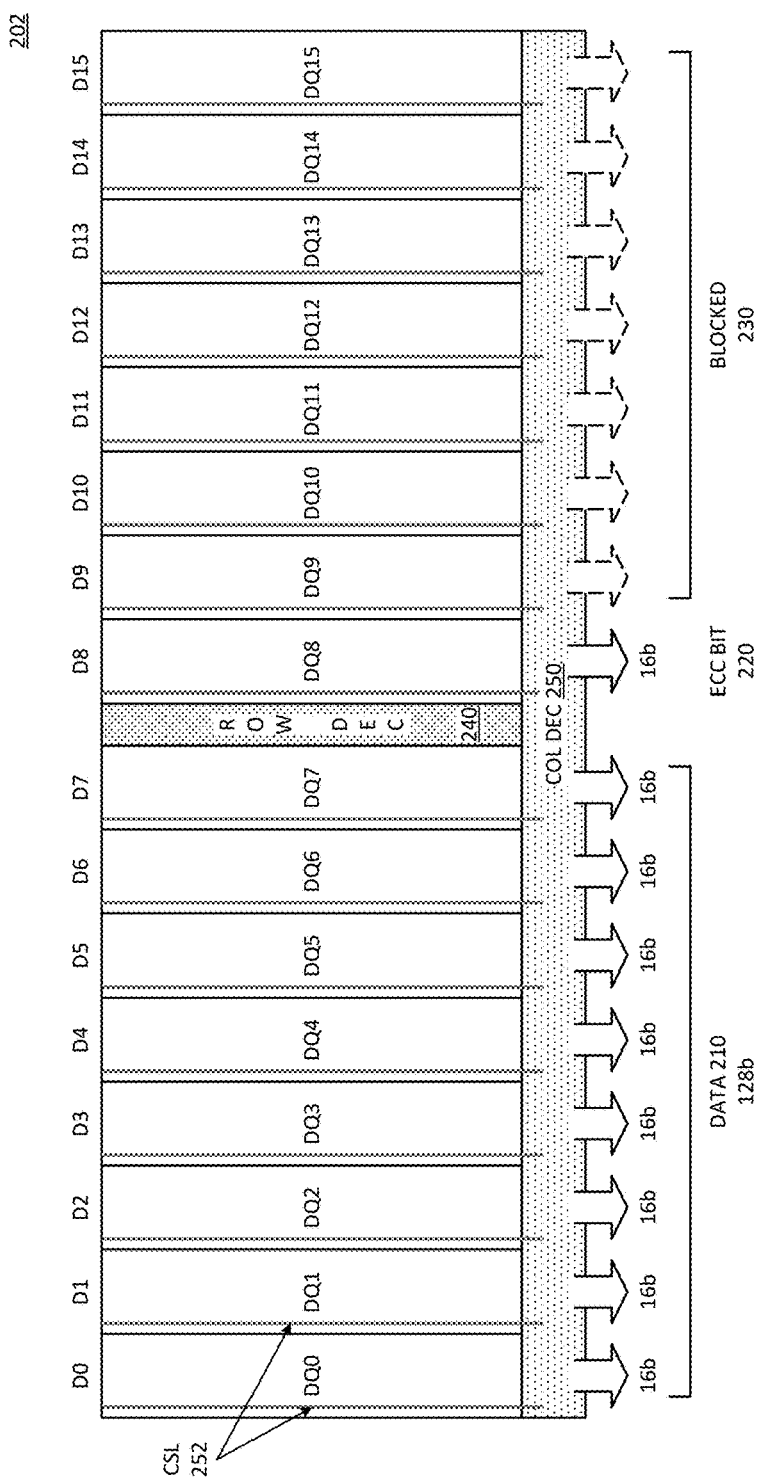
FIG. 2A is a representation of an example of a memory device interface where x16 interfaces used in byte mode enable a x9 interface for the implementation of ECC.

FIG. 2A is a representation of an example of a memory device interface where x16 interfaces used in byte mode enable a x9 interface for the implementation of ECC. System 202 provides a representation of the I/O for a memory device, with column select lines (CSLs) 252 illustrated for each of D0:D15, which represent the data I/O connectors. In one example, D0:D7 represent signal lines to interface with one memory die, and D8:D15 represent signal lines to interface with another memory die, where both dies operate in byte mode.

In one example, every DQ path couples to memory cells which provide 16 bits over a cycle of access. In one example, two x16 DRAMs can be placed in byte mode (e.g., via mode register configuration), and then operated as a x9 device instead of separate x8 devices. Thus, byte mode can have alternatives to either operate in byte mode as a x8 (or x(N/2) device) or to operate in byte mode with ECC as a x9 device (or a x((N/2)+1) device). In system 202, D0:D7 provide the data bits, and DQ8 provides the ECC bits. In one example, D9:D15 are blocked or gated. As blocked or gates signal lines, the signal lines may be inaccessible for access.

The implementation of two devices as a single x9 DRAM with ECC can occur without internal changes to the DRAM. However, such an implementation comes at the cost of lower bandwidth. Typically a DRAM doubles up the column select lines (CSL 252) in byte mode so each DQ has access to twice the array area, which leaves no unused cells. However, by gating or blocking I/O, the memory device has DQ signal lines that do not access the memory array, which leaves memory cells unused. In general, byte mode operation without some circuitry or logic to increase the application of certain columns of memory will result in unused memory cells. In examples provided below, the memory cells usage percentage can be increased with circuitry that increases the number of global column selects or global I/O lines.

For example, if 7 of 16 lines are unused, approximately 44% of the memory resources are unused. Such a loss of bandwidth is relatively high, but is the same percentage unused as doubling the number of memory resources (e.g., using two x16 devices), but without having to add the second memory device, which decreases system component costs. In one example, gating logic to column select lines can be used to block the DQ9:DQ15 memory area. In one example, the gating logic can include switches that disable access to the blocked signal lines.

System 202 represents a multichip or multi-die package having N=16 connectors in an I/O interface to couple to a channel of a system bus that has 9 signal lines, which is less than the N connectors. As illustrated, D0:D7 represent a first memory die, and D8:D15 represents a second memory die.

The first memory die and the second memory die, which not specifically shown in system 202, include 16 connectors, but can be operated in byte mode to tie memory array resources to the same I/O for the die. Thus, the eight DQs provide access to the memory resources that would otherwise be accessed through 16 DQ I/O connectors.

Row decoder (Dec) logic 240 represents circuitry to decode the row address in the package of system 202. Column decoder (Dec) logic 250 represents circuitry to decode the column address. CSL 252 represents column select lines that select across row addresses. System 202 can provide byte mode operation and column address select signaling to provide the combined channel from the two memory dies, where the first provides access to 8 (or N/2) connectors, and the second provides access to only 1 for ECC. In one example as illustrated, system 202 operates on a BL (burst length) of 16 UIs (or BL16). Thus, data 210 provides 128 bits from eight DQs over a 16 cycle burst (16 bits from each DQ). ECC bit 220 can also provide 16 bits, one for each cycle of eight DQs. The connectors for D9:D15 can be blocked signal lines 230, and so the data paths to the memory resources accessed by those paths are not used. In one example, blocked connectors 230 are blocked within the multi-die package through gating logic that disables the use of the connectors for corresponding signal lines of the second memory die.

Figure 2B:
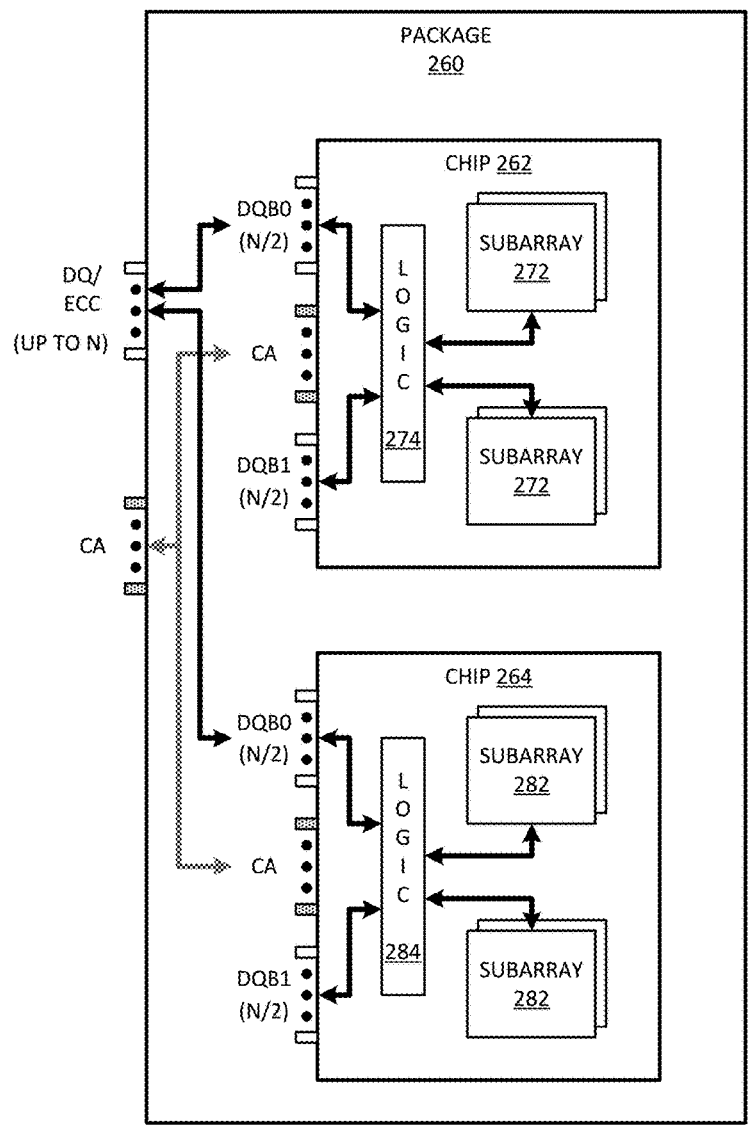
FIG. 2B is a block diagram of an example of a device where x16 interfaces used in byte mode enable a x9 interface for the implementation of ECC.

FIG. 2B is a block diagram of an example of a device where x16 interfaces used in byte mode enable a x9 interface for the implementation of ECC. System 204 provides an example of a hardware representation of the logical diagram of system 202. System 204 includes package 260, which represents a multi-device package. Package 260 includes two memory chips, 262 and 264.

Memory chip 262 includes multiple memory subarrays 272, and includes data paths mapped or routed between subarrays 272 and data connectors DQB0 and DQB1 (represented as D0:D7 and D8:D15, respectively, in system 202). Subarrays 272 represent individually addressable sections of the memory array, which refers to the memory storage cells collectively. The subarrays can refer to banks or bank groups or other partitioning of the memory cells, or a combination. In one example, chip 262 includes logic 274 which represents logic blocks or circuitry to route the data paths from the DQ I/O to subarrays 272. Logic 274 includes circuitry within chip 262 to selectively route data from subarrays 272 to DQ I/O. In one example, logic 274 enables the application of a byte mode by chip 262, where either DQB0 or DQB1 is selected for memory access, but the other is not used to externally connect to the memory chip. In one example, logic 274 can route all subarrays 272 to the selected DQ block in byte mode, which can enable use of the entire memory resources through fewer I/O connectors. CA represents command and address connectors to a command and address (CA) bus. In one example, the CA bus is shared between chips 262 and 264 to the CA connectors for package 260.

DQB0 represents a block of DQ I/O connectors, which represents a number of connectors. The number could be, for example, a byte or eight connectors, or a nibble or four connectors, or some other number of connectors. Chip 262 can be organized as "upper" and "lower" blocks DQB0 and DQB1, respectively. In one example, as illustrated, DQB0 and DQB1 each include N/2 connectors, but other numbers could be used. Thus, in one example, chip 262 includes N connectors for DQ I/O.

Chip 264 can be structured similarly or the same as chip 262, with DQB0 and DQB1 connectors, and CA connectors. Chip 264 is illustrated as having subarrays 282 mapped with data paths through logic 284 to the DQ I/O for the chip. In one example, logic 284 selectively maps the DQ I/O to subarrays 282, which can enable a byte mode or comparable operation.

In one example, the DQ I/O combine from chips 262 and 264 for the external DQ I/O for package 260. Thus, as illustrated, DQB0 from chip 262 and DQB0 from chip 264 can be routed to connect to DQ connectors on the package. DQB0 from chip 262 and DQB0 from chip 264 have N/2 connectors, and the DQ I/O for package 260 includes N connectors. In one example, the connectors for both chips 262 and 264 can be mapped to the DQ I/O connectors for package 260, but not all data paths in the package are used. While the interfaces for chips 262 and 264 provide the right number of signal lines for exchanging DQ signals, the N connectors of the DQ I/O on package 260 includes both data and ECC. Consider the example above, where N=16 but only eight DQ bits and one ECC bit are used. In such an implementation, the external channel for package 204 could have nine signal lines, which could be mapped, for example, as 8 DQ bits to chip 262 and 1 ECC bit to chip 264. In one example, the remaining 7 signal pathways of DQB0 for chip 264 can be gated or blocked, in addition to the connectors for DQB1, which could be internally blocked by routing logic 284.

Figure 3A:
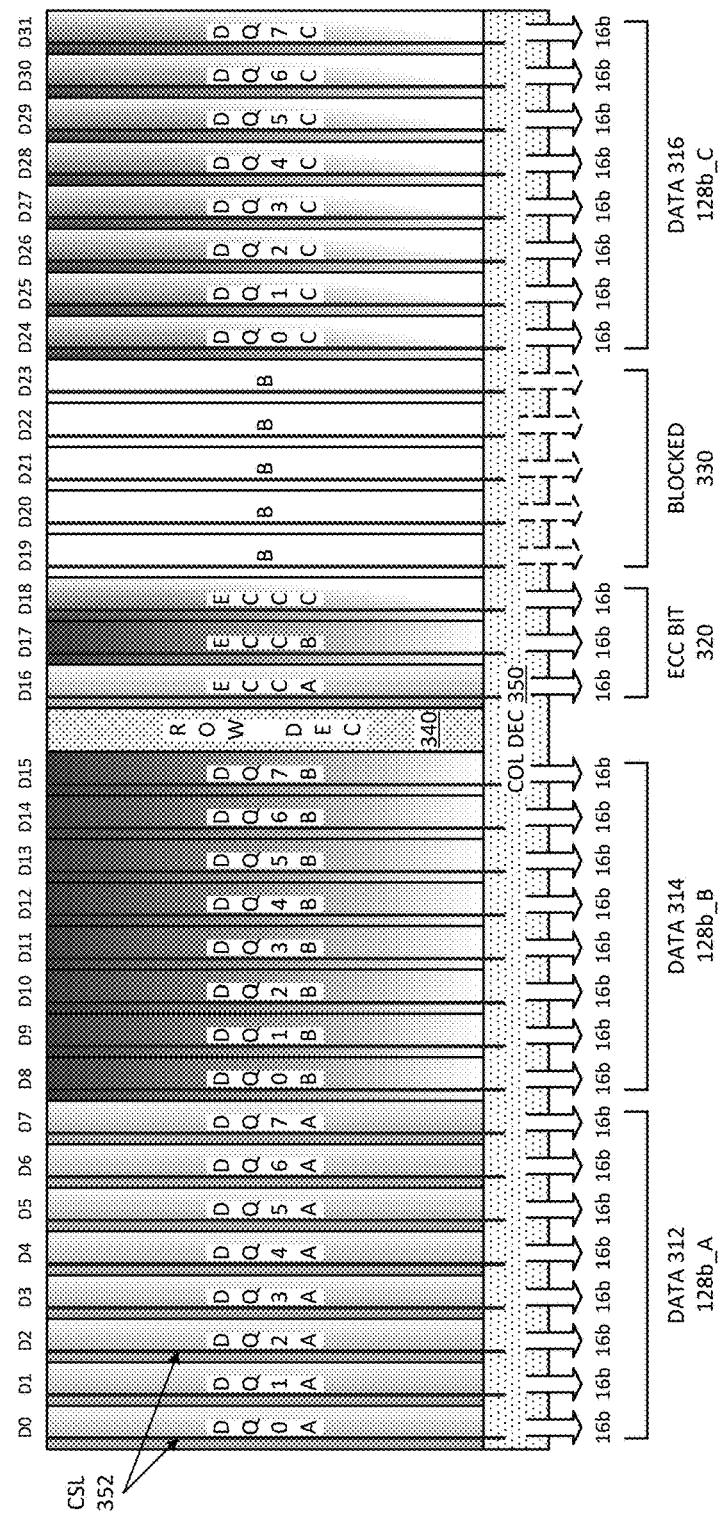
FIG. 3A is a representation of an example of a memory device interface where additional I/O paths are added to spread data and ECC bit paths over two x16 devices to enable three x9 interfaces for the implementation of ECC.

FIG. 3A is a representation of an example of a memory device interface where additional I/O paths are added to spread data and ECC bit paths over two x16 devices to enable three x9 interfaces for the implementation of ECC. System 302 provides a representation of the I/O for a memory device as an alternative to system 202. System 302 illustrates addressable memory array space as illustrated by the various data segments. The data segments are to be understood as representing addressable space, where as a whole, the memory space inside a memory device can be considered an array of memory cells. The same DQ space represented in system 202 can be considered to be subdivided in system 302, based on the application of more addressing through additional global I/O lines. The global I/O lines refer to data paths internal to the multi-die memory package, and which connect the memory dies to the package connectors. The additional global I/O lines can enable the additional selection of memory space based on CAS selection.

System 302 illustrates row decoder (Dec) 340 to provide row decoding, and column decoder (Col Dec) 350 to provide column decoding. Row address selection (RAS) triggers the row decoding hardware, and column address selection (CAS) triggers the column decoding hardware. CSLs 352 can provide CAS selection to enable selected DQs for the memory devices of system 302.

In system 302, CSLs 352 are illustrated for the 16 DQs of two devices used together, with D0:D15 for the first device, and D16:D31 for the second device, showing a total of 32 selectable signal lines within system 302. As illustrated, with the additional global select lines, system 302 can enable 3 separate groups of 8 DQs plus an associated ECC bit. Group or block A includes DQ0:DQ7 is illustrated as data 312, implemented in D0:D7 of the first device with the ECC bit as D16 of the second device. For terminology, D0 refers to a data I/O connector of a device, and DQ0 refers to the data path for the DQ signal line within the multi-device package. Thus, group or block B includes DQ0:DQ7 is illustrated as data 314, implemented in D8:D15 of the first device and ECC implemented in D17 of the second device. Group or block C includes DQ0:DQ7 is illustrated as data 316, implemented in D24:D31 in the second device with ECC implemented in D18 of the second device. It will be understood that the mappings are only illustrative, and different but comparable mappings could be used to implement the teachings provided herein. As illustrated, ECC bits 320 are implemented in contiguous portions of the second device, and D19D23 of the second device are blocked or unused portions 330, and can be gated or selectively enabled as described.

In one example, system 302 represents a configuration achieved by increasing the global I/O lines. In the specific example of system 302 relative to system 202, the global I/O lines are doubled. The increase in global I/O lines allows finer granularity of the split of the memory area, and in this case allows a 3-way split across two devices. It will be understood that the 3-way split actually separates the I/O into five portions as set out above, with three x8 interfaces with corresponding ECC DQ paths, and an unused portion. The configuration of system 302 reduces the unused space down to 5 of 32 columns, or approximately 16%. In one example, system 302 includes multiplexing or muxing logic to select from three different memory areas of DQ0:DQ7 (e.g., A, B, and C). In one example, the selection of the different blocks or memory areas can be accomplished with multiplexing global I/O lines based on the CAS signal.

Figure 3B:
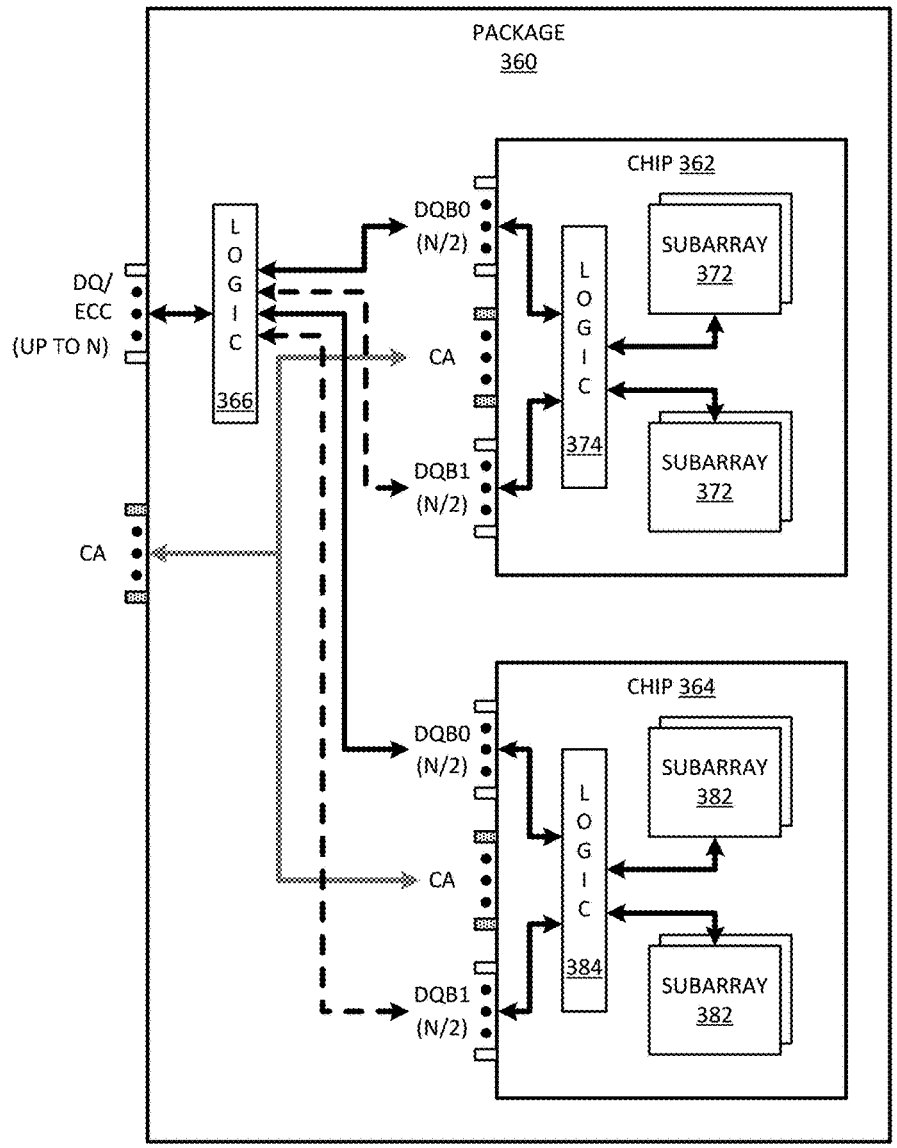
FIG. 3B is a block diagram of an example of a device where additional I/O paths are added within a fixed-width channel to spread data and ECC bit paths over two x16 devices to enable three x9 interfaces for the implementation of ECC.

FIG. 3B is a block diagram of an example of a device where additional I/O paths are added within a fixed-width channel to spread data and ECC bit paths over two x16 devices to enable three x9 interfaces for the implementation of ECC. System 304 represents one example of a hardware implementation of the logic of system 302.

System 304 includes package 360, which represents a multi-device package. Package 360 includes two memory chips, 362 and 364. The individual components of package 360 can be the same or similar to those of package 260, described above. The descriptions will not be repeated in detail. Chip 362 includes memory subarrays 372 and logic 374 to route the subarrays selectively to DQ I/O connectors of the chip. Similarly, chip 364 includes memory subarrays 382 and logic 384 to route the subarrays selectively to DQ I/O connectors of the chip. In one example, the CA bus is shared between the chips as a multi-drop bus.

Package 360 differs from package 260 in that package 360 includes logic 366 to select among the additional global I/O lines. In one example, package 360 includes connectors for the external bus, which can be up to N signal lines, where chip 362 and chip 364 both have native N-bit interfaces with N data I/O connectors. Logic 366 maps connectors of chips 362 and 364 to the external connectors of package 360. In one example, one or more signal lines of the CA bus operate as control for logic 366. In one example, logic 366 selects among different internal data paths to couple to the external DQ I/O that provides data and ECC.

In one example, chips 362 and 364 operate in regular mode as opposed to operating in byte mode. Logic 366 can provide the selection of connectors for the chips instead of having logic within the chips provide byte mode routing. In one example, chips 362 and 364 within package 360 can be operated in byte mode, and thus the additional pathways are illustrated as dashed. In such a configuration, logic 366 would select which chip to select, and additional selection logic is provided to the chips to enable the operation of logic 374 and 384 to provide additional selection. Thus, logic internal to package 360 can work in conjunction with logic internal to the memory chips to select the mapping of data I/O to DQs.

Figure 4A:
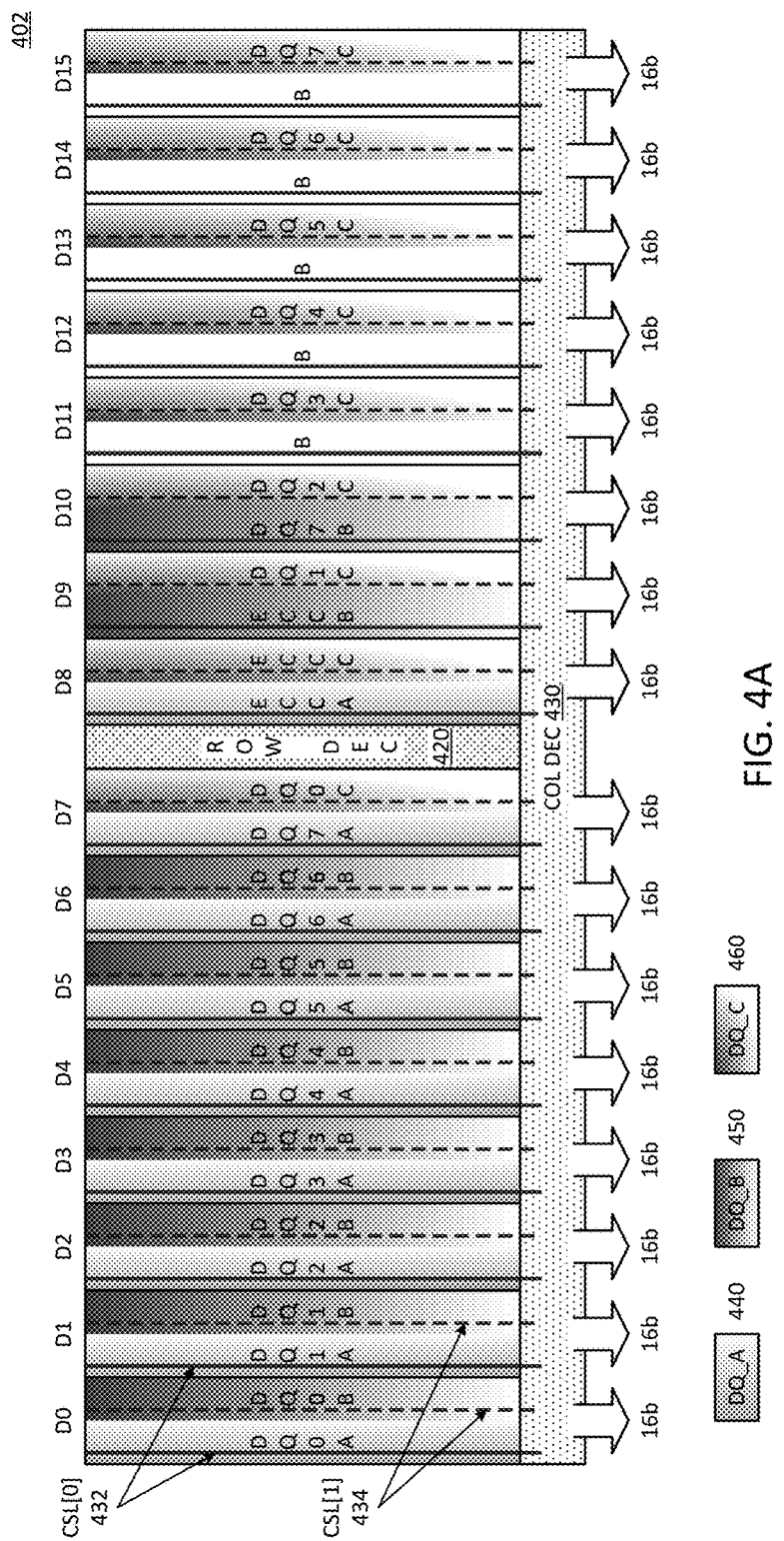
FIG. 4A is a representation of an example of a memory device interface where column select lines are multiplexed to separate the memory area into multiple portions for spreading data and ECC bit paths over two devices without having to increase I/O paths.

FIG. 4A is a representation of an example of a memory device interface where column select lines are multiplexed to separate the memory area into multiple portions for spreading data and ECC bit paths over two devices without having to increase I/O paths. System 402 provides a representation of the I/O for a memory device as an alternative to system 202 or system 302. System 402 illustrates addressable memory array space as illustrated by the various data segments. Like system 302, system 402 illustrates the same DQ space represented in system 202, subdivided based on the application of more addressing. In system 402, the application of more addressing is accomplished through multiplexing the CAS selection.

In one example of system 402, there are first and second memory devices or memory dies, with the first one having D0:D7 and the second one having D8:D15. D0:D15 represent data I/O connectors for the memory devices. System 402 represents a multi-device package with row decoder (Dec) logic 420 to implement row decoding, and column decoder (Col Dec) logic 430 to implement column decoding. In one example, each data I/O connector D0:D15 can transfer (e.g., send for a read command or receive for a write command) a bit per cycle of a burst length. The example of system 402 assumes BL=16, and thus, each data I/O connector can transfer 16 bits.

System 402 includes multiplexing or muxing logic (not explicitly shown) to select from three different areas or groups, which can be thought of as three separate x9 interfaces having eight DQs and an ECC bit or signal. While it will be understood that different configurations are possible, as illustrated, portion A or group A includes DQ0:DQ8 (including the ECC bit). Group A (DQ_A 440) is implemented with the first part of D0:D7 of the first memory die and D8 of the second memory die. Portion B or group B (DQ_B 450) includes DQ0:DQ6 of the first memory die and DQ9 and DQ10 of the second memory die. Portion C or group C (DQ_C 460) includes DQ7 f the first memory die and DQ8:DQ15 of the second die. The selection of various DQs can be controlled through CAS selection with CSL[0: 1], shown as CSL[0] 432 CSL[1] 434. System 402 also illustrated other portions labeled "B", referring to portion that can be blocked from use.

With system 402, the DRAM can include multiplexers in the column select configuration to provide control over CSL[0:1] without having extra I/Os. For example, in an example of system 302, the configuration can be achieved with additional column select logic and additional global I/Os. System 402 multiplexes the column selects and achieves a similar ability to control the column select. In one example, system 402 includes additional muxing logic to select from the different DQ groups. In one example, system 402 also includes additional gating logic for the unused area. Thus, system 402 can represent the 16 connectors as 32 different data paths based on the selection logic.

Figure 4B:
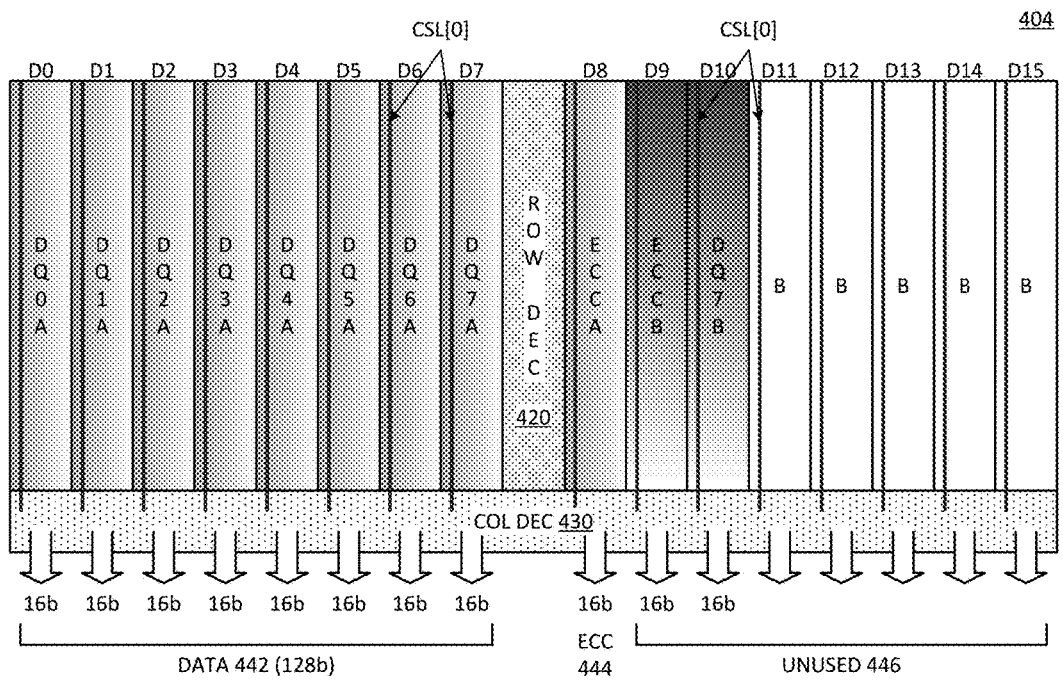
FIG. 4B is a representation of an example of a memory device interface with both column select lines of FIG. 4A non-asserted.

FIG. 4B is a representation of an example of a memory device interface with both column select lines of FIG. 4A non-asserted. System 404 illustrates an example of system 402 with CSL[0] selected or set, and CSL[1] deselected or not set, for both memory devices. As a result of selecting CSL[0] for both memory devices, the first memory device selects or enables D0:D7 as DQ_A[0:7] for data 442, and the second memory device selects or enables D8 as ECC_A for ECC 444. D9:D15 can be unused sections 446.

Figure 4C:
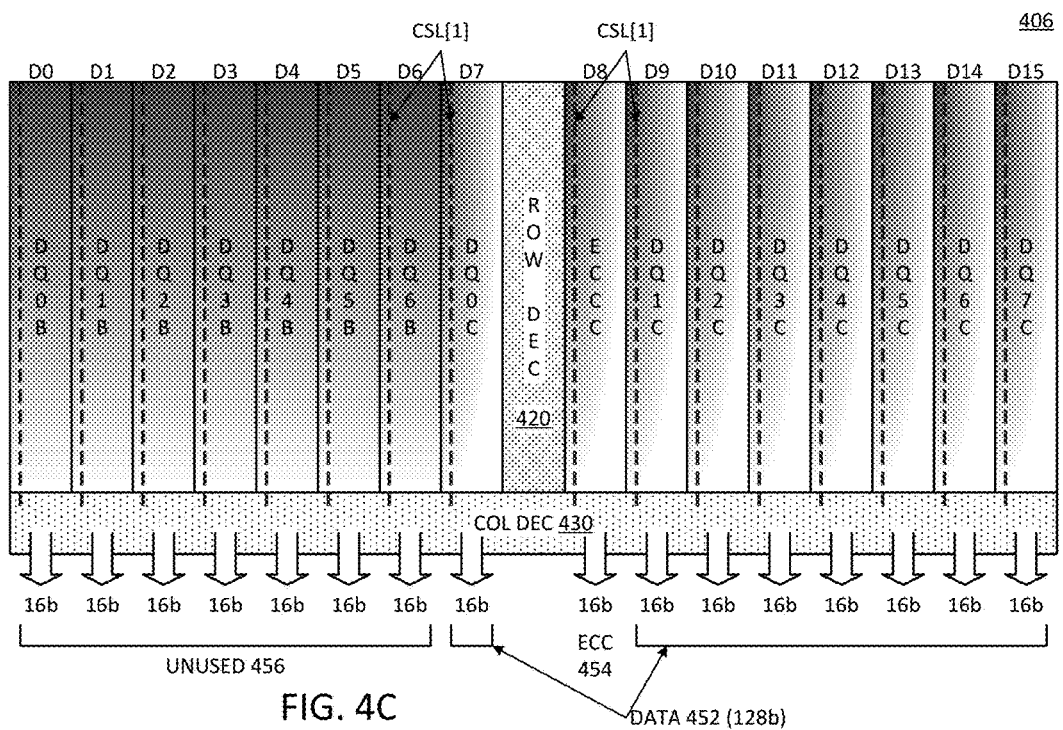
FIG. 4C is a representation of an example of a memory device interface with both column select lines of FIG. 4A asserted.

FIG. 4C is a representation of an example of a memory device interface with both column select lines of FIG. 4A asserted. System 406 illustrates an example of system 402 with CSL[1] selected or set, and CSL[0] deselected or not set, for both memory devices. As a result of selecting CSL[1] for both memory devices, the first memory device selects or enables D7 as DQ_C[0] and the second memory device selects or enables D9:D15 as DQ_C[1:7] for data 452. D0:D6 of the first memory device can be unused selections 456. The second device can select D8 as ECC_B for ECC 454.

Figure 4D:
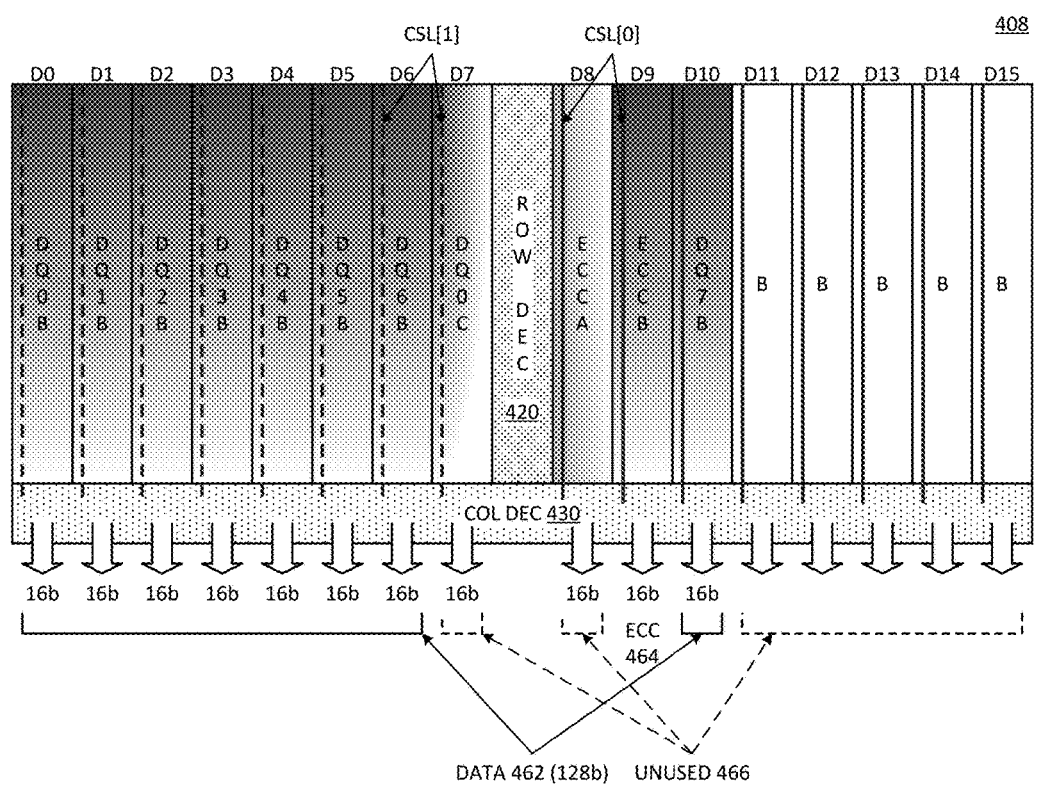
FIG. 4D is a representation of an example of a memory device interface with one column select line of FIG. 4A asserted and one non-asserted.

FIG. 4D is a representation of an example of a memory device interface with one column select line of FIG. 4A asserted and one non-asserted. System 408 illustrates an example of system 402 with CSL[1] set or selected for the first memory device, and CSL[0] set or selected for the second memory device. In such an example, the first memory device selects or enables D0:D6 as DQ_bB[0:6] and the second memory device selects or enables D10 as DQ_bB[7] for data 462. The second device also selects or enables D9 as ECC_B for ECC 464. D7, D8, and D11:D15 can be unused sections 466.

Figure 4E:
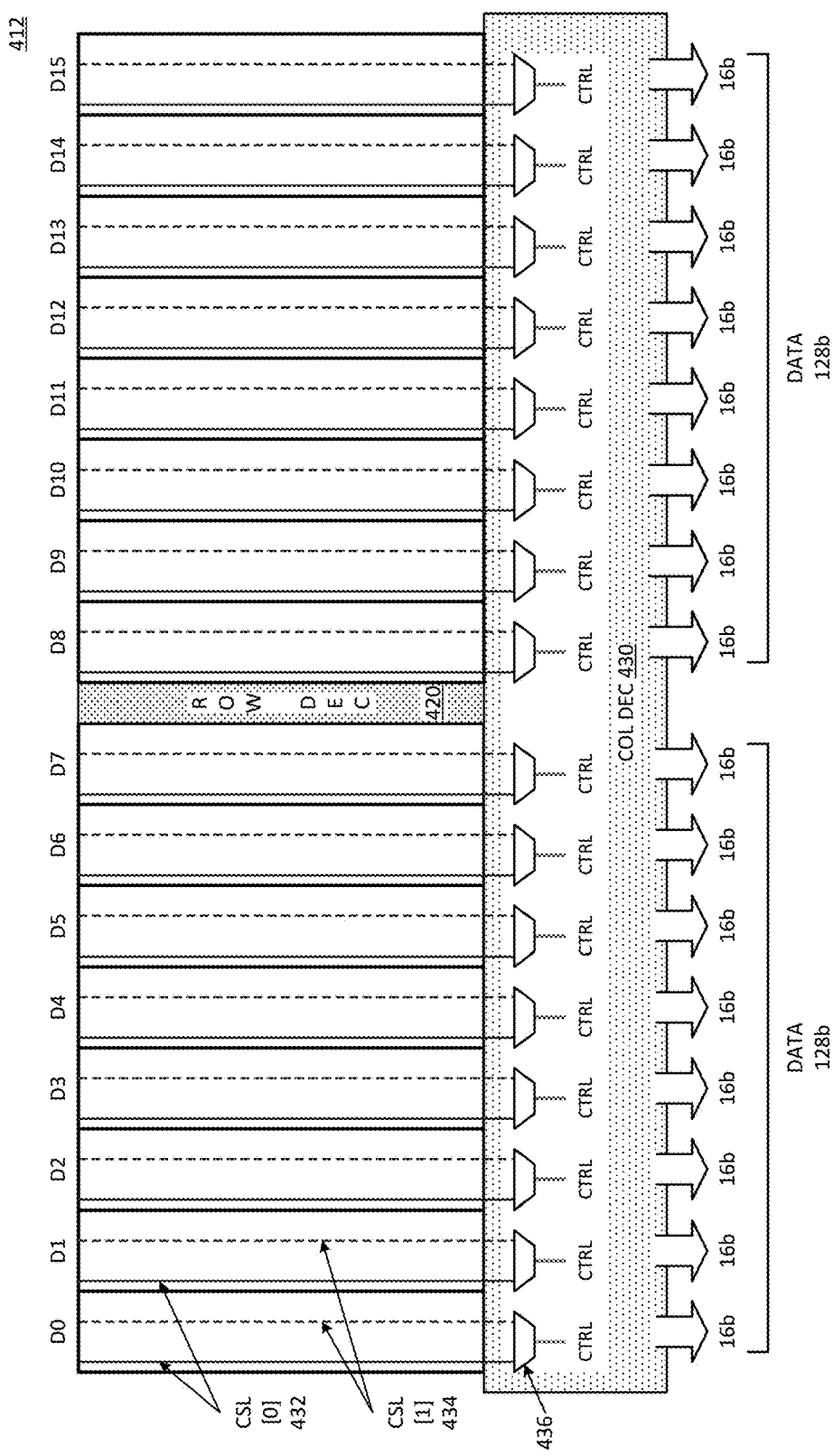
FIG. 4E is a block diagram of an example of a memory device interface where column select lines are multiplexed to separate the memory area into multiple portions for spreading data and ECC bit paths over two devices without having to increase I/O paths.

FIG. 4E is a block diagram of an example of a memory device interface where column select lines are multiplexed to separate the memory area into multiple portions for spreading data and ECC bit paths over two devices without having to increase I/O paths. System 412 illustrates one example of system 402, with multiplexing circuitry 436 in the column decoder logic 430.

In one example, the muxing logic selects either CSL[0] 432 or CSL[1] 434 depending on control logic, which can be a control signal, a column address select signal, or a combination. The selection of the CSL determines which portions of the memory resources are selected for output as data. The data can be from different portions in accordance with what is illustrated in system 402, and can include blocked or unused memory portions. With multiplexing circuitry 436, which can include a multiplexer, system 412 can select data bits and ECC (e.g., 8 data bits and 1 ECC bit) from among D0:D15, including different portions of the memory. The control signal can be or be based on the CAS signal for the memory access command. The multiplexing circuitry can select among different CAS signal lines or CSL signals.

Figure 4F:
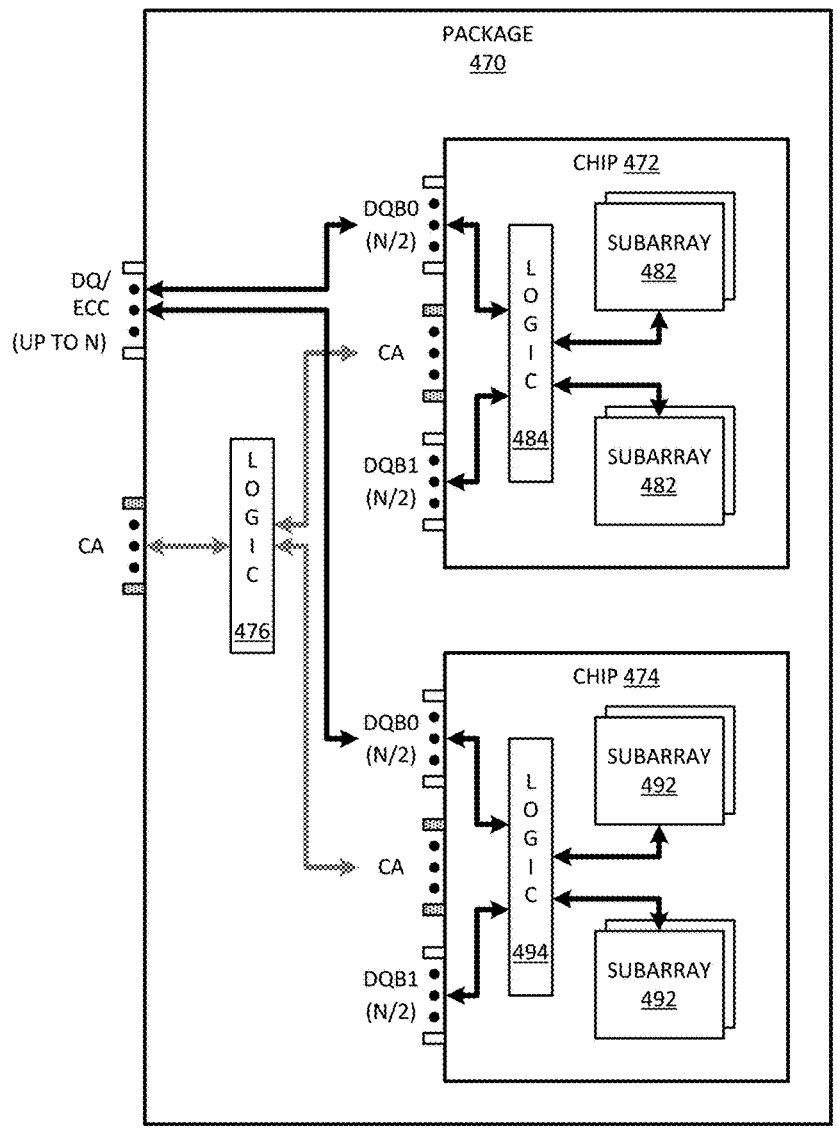
FIG. 4F is a block diagram of an example of a device where column select lines are multiplexed to separate the memory area into multiple portions for spreading data and ECC bit paths over two devices without having to increase I/O paths.

FIG. 4F is a block diagram of an example of a device where column select lines are multiplexed to separate the memory area into multiple portions for spreading data and ECC bit paths over two devices without having to increase I/O paths. System 414 represents one example of a hardware implementation of the logic of system 402.

System 414 includes package 470, which represents a multi-device package. Package 470 includes two memory chips, 472 and 474. The individual components of package 470 can be the same or similar to those of package 260, described above. The descriptions will not be repeated in detail. Chip 472 includes memory subarrays 482 and logic 484 to route the subarrays selectively to DQ I/O connectors of the chip. Similarly, chip 474 includes memory subarrays 492 and logic 494 to route the subarrays selectively to DQ I/O connectors of the chip. In one example, the CA bus is shared between the chips as a multi-drop bus.

Package 470 differs from package 260 in that package 470 includes logic 476 to select among the additional global I/O lines. In one example, package 470 includes connectors for the external bus, which can be up to N signal lines, where chip 472 and chip 474 both have native N-bit interfaces with N data I/O connectors. In one example, logic 476 maps connectors of chips 472 and 474 to the CA bus of package 470. In one example, one or more signal lines of the CA bus operate as control for logic 476. In one example, logic 476 selects among different internal command signal paths to couple to the CA bus I/O that provides commands to package 470. In one example, chips 472 and 474 operate in byte mode. Logic 476 can provide the selection of command connectors for the chips to provide CAS selection and the mapping of subarrays to the external data I/O connectors of package 470.

Figure 5:
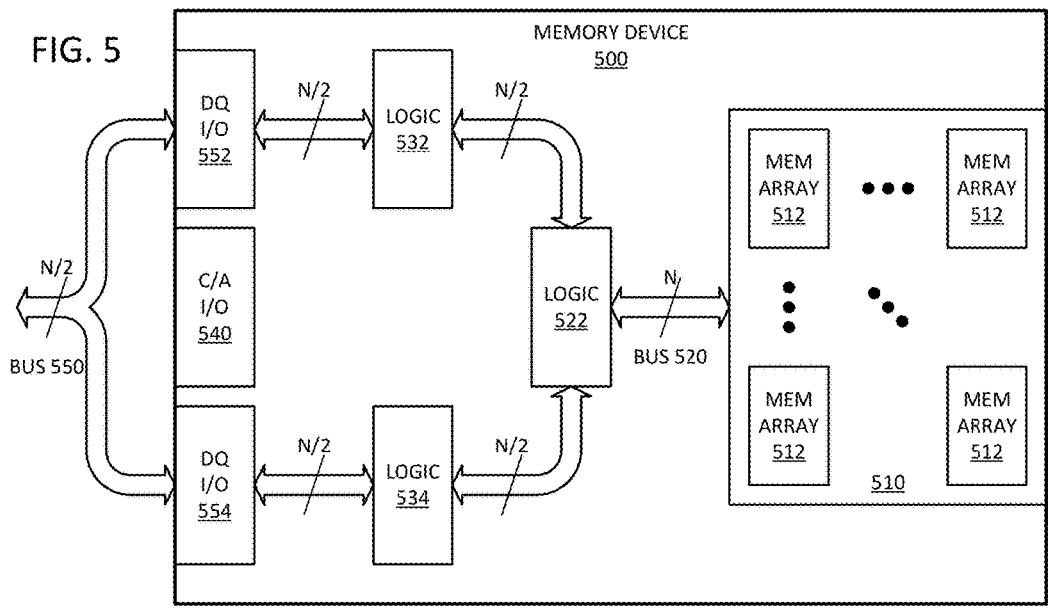
FIG. 5 is a block diagram of an example of a memory device that can interface with system data buses of different bandwidth to enable byte mode operation.

FIG. 5 is a block diagram of an example of a memory device that can interface with system data buses of different bandwidth to enable byte mode operation. As referred to throughout, byte mode can refer to a mode where fewer than all of the standard interface number of bits is transferred. Typically the number will be half the typical I/O interface bandwidth (e.g., 8 bits instead of 16, or 4 bits instead of 8). Memory device 500 can be one example of memory dies 122 of system 100. In one example, memory device 500 includes more elements than those illustrated. More specifically, memory device 500 illustrates a single I/O channel, where each channel internally routes N bits (e.g., 256 bits). It will be understood that in system 500, N refers to the total bandwidth or the total number of bits, which can be understood as the number of external connectors times the burst length. The same principle holds as what is referred to previously, seeing that having half the number of DQ connectors active for a burst length of transfers will result in half the number of bits transferred. In one example, memory device 500 can include two separate channels, each capable of internally routing N bits.

Memory device 500 includes M memory arrays 512. The M memory arrays 512 are part of group 510. Memory arrays 512 can be organized in groups in any of a number of different ways. In one example, group 510 includes a number of memory arrays that can read or write up to N data bits. In one example, group 510 includes a number of memory arrays that can read or write up to N/2 data bits. Bus 520 represents an internal bus within memory device 500. Bus 520 has available bandwidth of N bits. In one example, the available bandwidth of N bits represents bits from all M memory arrays 512.

Logic 522 represents signal lines, logic circuits, and/or other elements within memory device 500 that allow memory device 500 to route the N bits of bus 520 towards two separate I/O output locations. In one example, logic 522 includes interfaces to memory arrays 512 and can select which memory arrays and locations within the arrays will be read or written for each memory access transaction. Thus, specific locations within the memory arrays can be selected for read and/or for write for each transaction. In one example, logic 522 can terminate one path or the other for a specific memory access transaction. For example, on a read transaction, memory device 500 can prefetch N bits, and N/2 bits can be dropped without being sent. In one example, logic 522 disables one path or the other for a write transaction.

Logic 532 and 534 represent signal lines, logic circuits, and/or other elements within memory device 500 that interfaces with data I/O connectors or pins for the memory device. Logic 532 and 534 can be or include or be included in the data path from group 510 which represents the memory core, and the I/O. Specifically, logic 532 selectively interfaces memory arrays 512 with DQ I/O 552, and logic 534 selectively interfaces memory arrays 512 with DQ I/O 554. The designation DQ I/O refers to the data bus interface. The logic elements selectively interface the I/O with the memory arrays in that the logic elements can select data bits received at the I/O connectors to be routed to and written to selected memory arrays 512. The logic elements selectively interface the I/O with the memory arrays in that the logic elements can select data bits received from memory arrays 512 to be routed and sent from DQ I/O 552 and/or DQ I/O 554.

In one example, DQ I/O 552 and DQ I/O 554 straddle command/address (C/A) I/O connectors or pins 540. The data I/O connectors straddle the C/A I/O connectors in that the data I/O connectors are not all physically adjacent on the die or package, but there are two groups of data I/O connectors physically separated by C/A I/O connectors 540. Such a configuration would allow decode logic (not specifically shown) to be located "centrally" within memory device 500 relative to the signal lines from the data I/O connectors (i.e., 552, 554) to memory arrays 512.

Data I/O connectors 552 and 554 interface with signal lines of system data bus 550. It will be observed that bus 550 is indicated as having a bandwidth of N/2 bits, while bus 520 has a bandwidth of N bits. Thus, bus 550 has a lower bandwidth for interfacing with memory device 500 than a total available internal bandwidth of bus 520. It will be understood that bus 550 could connect to multiple other memory devices and/or other memory device channels (e.g., if memory device 500 included another channel with a separate group of memory arrays). Thus, bus 550 could actually have a higher bandwidth than bus 520 if the signal lines of bus 550 were separated to connect separately to different memory devices. However, for purposes of interfacing with memory device 500, bus 550 is considered to have a lower bandwidth when the number of signal lines of bus 550 interfacing memory device 500 has a lower bandwidth than what bus 520 is capable of transferring within a burst length of transfer periods.

Additionally, it will be observed that bus 550 is indicated as having a bandwidth of N/2 bits, which is the same number of bits illustrated to interface to each of data I/O 552 and data I/O 554. There are any of a number of different configurations that can be provided to interface memory device 500 with bus 550. In one example, for a particular transaction, all N/2 bits exchanged (either read or write) between memory device 500 and an associated memory controller (not specifically shown), are exchanged via either I/O 552 or I/O 554, while the other I/O does not exchange any bits for the transaction. Thus, I/O 552 and I/O 554 can connect to the same N/2 signal lines, and logic (e.g., logic 532, 534, 522, and/or other logic) can select which I/O to use for a particular memory access transaction.

In one example, both I/O 552 and I/O 554 provide N/4 I/O connectors each to interface with bus 550. Thus, bus 550 is separated among I/O 552 and I/O 554. Internally, the N/2 possible data bits to be routed from I/O 552 to logic 532 and/or from I/O 554 to logic 534 could be N/4 bits instead of N/2 bits as shown. In one example, logic 534 can select N/4 bits and route them to I/O 552 and bypass I/O 554. Thus, I/O 552 will provide all N/2 I/O interfaces, but with N/4 bits routed through logic 532, and N/4 bits routed through logic 534. It will be understood that similarly, logic 532 could select N/4 bits to route to I/O 554, bypassing I/O 552. Thus, in one example, logic 532 and/or logic 534 can include multiplexing logic to selectively route signal lines between different memory arrays to the same I/O connectors.

In one example, memory device 500 always generates N bits for a read by accessing data bit(s) from all M memory arrays or cores. Memory device 500 can exchange N/2 bits over bus 550 by selecting N/2 of the N bits, and dropping any other prefetched bits. In one example, memory device 500 can exchange N/2 bits over bus 550 by selecting N/4 bits from two different groups of M/2 memory arrays 512 (and dropping the other N/4 bits accessed from each of the two groups of memory arrays). In one example, memory device 500 can exchange N/2 bits over bus 550 by selecting N/2 bits from one group of M/2 memory arrays 512 and dropping the N/2 bits accessed from the other group of M/2 memory arrays 512.

Similarly, memory device 500 is capable of writing N bits by writing data bit(s) to all M memory arrays or cores 512. In one example, memory device 500 writes N/2 bits instead of N bits by selecting M/2 memory arrays to write to, and not writing to the other M/2 memory arrays. In one example, memory device 500 writes N/4 bits to one selected group of M/2 memory arrays 512, and N/4 bits to another selected group of M/2 memory arrays 512. In such a case, logic in the memory arrays can determine what bits to write, and/or select which memory arrays to write and which memory might not be written on a particular memory access transaction. Thus, for reads and writes, memory device 500 can exchange N/2 bits at one common DQ I/O or the other (i.e., 552, 554) or exchange N/4 bits from both DQ I/Os. Memory device 600 can select different groups of the M memory arrays to write to or read from, and can route N/2 bits to one group or another (and none to the non-selected group), or N/4 bits each to both groups.

In one example, the configuration of memory device 500 with DQ I/O 552 and DQ I/O 554 separated by C/A I/O 540 can be referred to as providing N bits from the "core," referring to the memory arrays and routing bits from the core to "top" and "bottom" nibbles or portions of the total I/O. Such reference to "top" and "bottom" will be understood to reference to which I/O connectors are designated for memory device 500 as the MSB (most significant bit) and the LSB (least significant bit), rather than a spatial orientation of the physical packaging. How to split the memory arrays or memory cores, and how to route the arrays to the I/O, and which I/O to physical locate where on the packaging are design choices. There are any of a number of configurations that will be understood by those skilled in the art.

Figure 6:
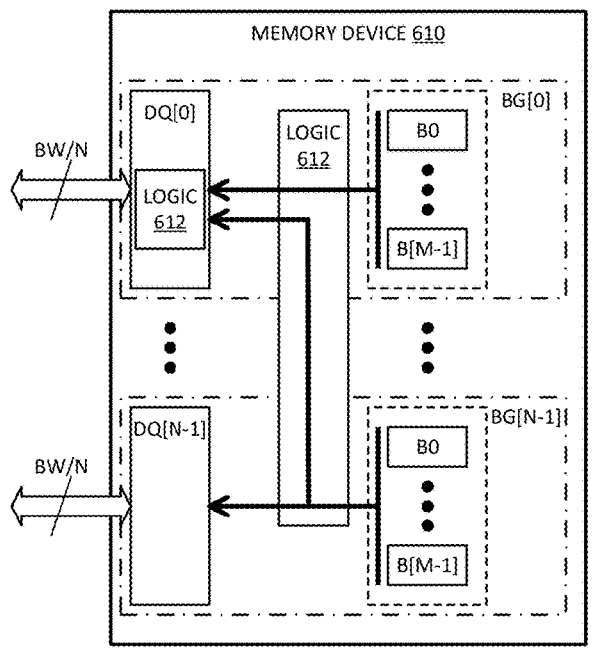
FIG. 6 is a block diagram of an example of a memory device that can interface in different modes with system data buses of different bandwidth.

FIG. 6 is a block diagram of an example of a memory device that can interface in different modes with system data buses of different bandwidth. Memory device 610 is one example of a memory device in accordance with memory dies 122 of system 100. In one example, memory device 610 includes more elements than those illustrated. In one example, memory device 610 includes multiple channels of memory. For purposes of one example, memory device 610 only illustrates a single channel. Each channel is independently accessed and controlled. Thus, the timing, the data transfer, command and address exchanges and other operations are separate for each channel. In one example, settings for each channel are controlled by separate mode register or other register settings.

Memory device 610 includes N separate interface paths. While a channel can be an interface path, in one example, a channel can include multiple interface paths. In one example, a channel includes multiple separate and independent interface paths. For purposes of example, consider that each interface path is associated with a group of memory resources that can be separately accessed as a bank group. Thus, each bank group BG[(N−1):0] is illustrated including M banks. In bank mode, in one example, memory device 610 appears to have M banks of memory, where each bank is a virtual bank. Thus, bank B[0] of BG[0] and bank B[0] of BG[N−1] operate together as a logical bank, and are accessed in parallel for a memory access command identifying bank B[0]. In bank group mode, each of the M banks of each bank group is separately addressable, within each bank group. Thus, the internal controller of memory device 610 (not specifically shown) accesses a specific bank group and a specific bank within that bank group. Corresponding banks of other bank groups will not be accessed in bank group mode. Thus, for example, while in bank mode, bank B[0] of BG[0] and bank B[0] of BG[N−1] can operate together and both will execute an access command, but in bank group mode bank B[0] of BG[0] and bank B[0] of BG[N−1] will be addressed separately and not execute the same access command.

Logic 612 determines how to route bits to and from the memory banks, and can be or include or be included in the data paths between the memory arrays and the I/O. Logic 612 represents any logic or circuitry within memory device 610 that selects how to route bits, and executes operations to route the bits based on the mode. Logic 612 can include signal lines, multiplexers, selection logic, and/or other logic, and/or other circuitry. In one example, in bank mode, memory device 610 includes a bus length of BW bits (bandwidth), with N different I/O interfaces (DQ[(N−1):0]) each providing BW/N bits. In one example, in bank group mode, bits are internally routed from the selected bank group to a single BW/N bit interface (e.g., DQ[0]). Thus, external devices, such as a memory controller, only have BW/N signal lines to exchange data with memory device 610 (per channel, assuming multiple channels). The I/O interfaces represent signal lines, logic circuits, and/or other elements within memory device 610 that allow memory device 610 to exchange (send and receive) data with a device external to memory device 610.

Consider for purposes of example an implementation where N equals 2. DQ0 and DQ1 can be considered independent interface paths in a bank mode, because each group of banks (BG0 and BG1) provides data to separate I/O interfaces. The memory banks provide data in parallel to provide the full bandwidth possible from memory device 610. In a bank group mode, each group of banks (BG0 and BG1) operates as separate bank groups, and access can be interleaved to the separate banks. Thus, access to one bank will not prevent access to another bank in a different bank group. In one example, a memory device includes 8 bank groups with 4 banks each. In one example, a memory device includes 4 bank groups with 8 banks each. In one example, a memory device includes 4 bank groups with 4 banks each. Other configurations are possible.

Figure 7:
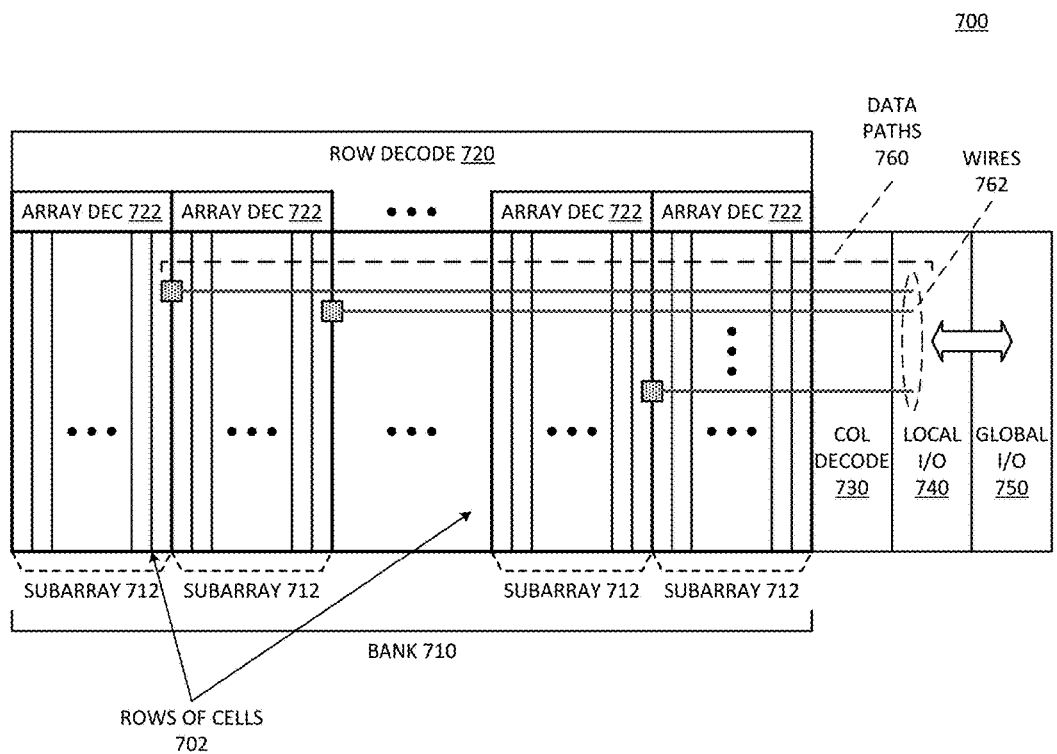
FIG. 7 is a block diagram of an example of a memory device illustrating I/O paths, and select logic to the memory elements.

FIG. 7 is a block diagram of an example of a memory device illustrating I/O paths, and select logic to the memory elements. Memory 700 illustrates components of a memory device with a specific mapping of I/O to portions of the memory array, in accordance with any example described herein. For example, memory 700 can represent an example of memory device in accordance with memory dies 122 of system 100.

Memory 700 includes bank 710, which includes multiple rows of memory cells 702. The vertical rectangles of the diagram represent the rows. In one example, bank 710 is organized as multiple subarrays 712. Subarray 712 or an array can refer to a group of rows 702. An access command (either a Read command or a Write command) triggers command signal lines that are interpreted by row decode logic 720 to select a row or rows for the operation. In one example, row decode logic 720 includes subarray or array decode logic 722 to select a specific subarray 712 of bank 710.

Memory 700 includes column decode logic 730 to select a column of data, where signal lines from specific subarrays can be output to sense amplifiers and routed with local I/O 740 to global I/O 750. In one example, memory 700 supports ECC, and includes additional selection logic in column decode logic 730 relative to a memory device that does not support device-level ECC. In one example, column decode logic 730 includes multiplexers to selectively connect certain columns to a common I/O connector. Local I/O 740 refers to the routing circuitry to transfer data of specific subarrays 712. Global I/O 750 refers to the routing circuitry that couples the local I/O to the external I/O connectors of memory 700.

In one example, local I/O 740 includes logic to map specific signal lines from subarrays 712 to specific I/O paths or data paths 760 that connect to specific global I/O connectors. Data paths 760 can include wires 762 and circuits to switch or select the paths to connect memory cells to the I/O for the device. In one example, memory 700 supports ECC, and includes additional global I/O 750 logic or additional local I/O logic 740, or both, relative to a memory device that does not support ECC. The additional I/O in the data paths can enable connection of multiple columns to the same I/O path, and decode logic can determine which connections to make. If subsets of memory arrays and the data paths to and from these subsets are mapped to a single I/O connector, the system can use the specific columns selectively for storage of ECC data. Data path 760 can refer to the wires, traces, logic gates, and other circuitry to transfer data between the subarrays and the I/O. In one example, the data paths refers to all connection logic and I/O logic to couple the data array to the external-facing connector or pad for the device package.

Figure 8:
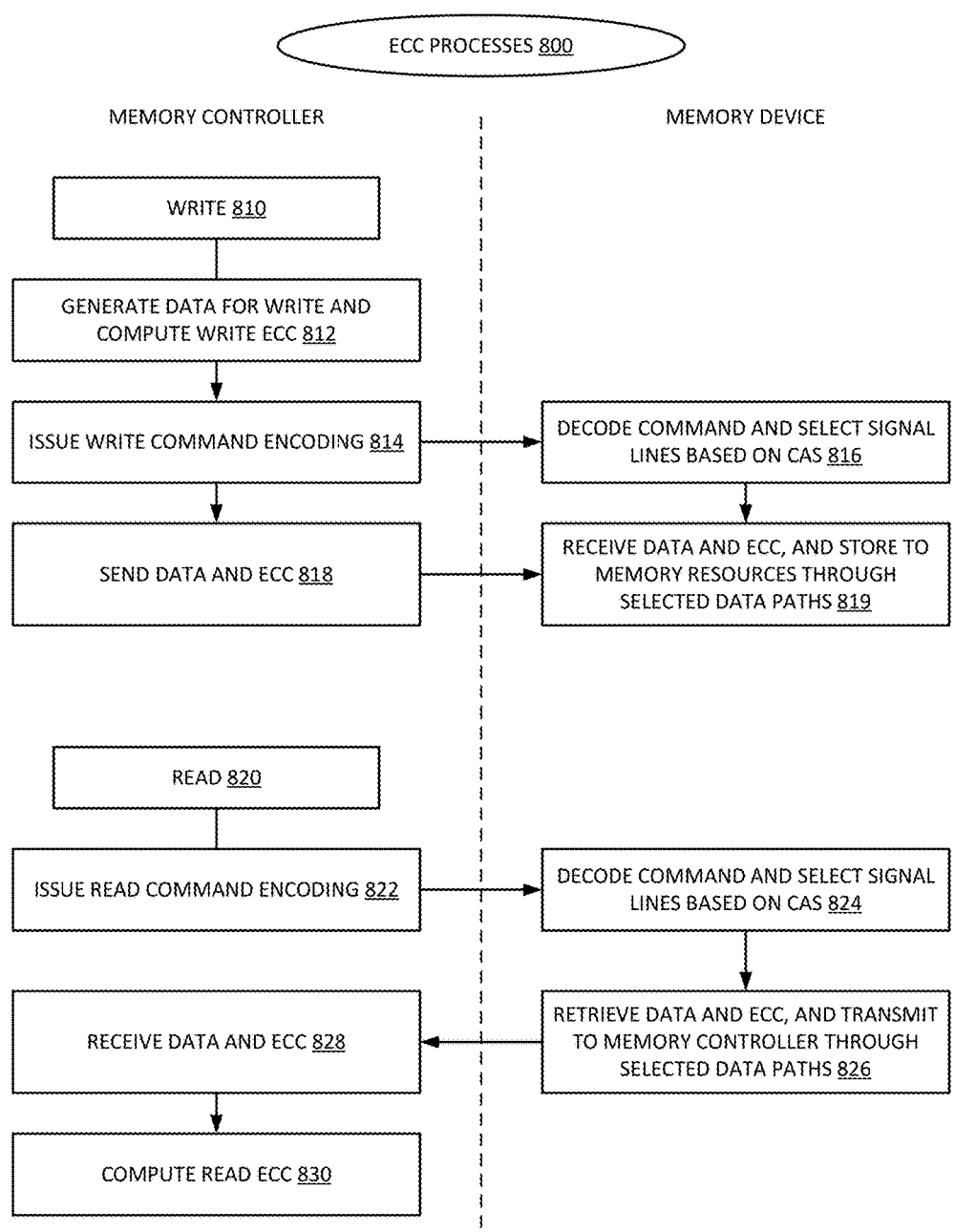
FIG. 8 is a flow diagram of an example of a process for providing ECC in a multichip environment with a fixed-width channel that traditionally does not implement ECC.

FIG. 8 is a flow diagram of an example of a process for providing ECC in a multichip environment with a fixed-width channel that traditionally does not implement ECC. Process 800 can include write process 810 and read process 820.

In the write process, in one example, the memory controller generates data for a write and computes the write ECC, at 812. The memory controller can issue the write command encoding, at 814. The memory controller can send the data and ECC associated with the write command, at 818.

In response to the write command encoding, the memory device can decode the command and select the signal lines based on the CAS, at 816. The memory device retrieves the data and ECC from the memory controller. The memory device stores the data and ECC to the memory resources through the selected data paths, at 819. The memory device selects the data paths from the external connectors of a multi-device package to memory dies in accordance with any example described.

In the read process, in one example, the memory controller issues read command encoding, at 822. In response to the read command, the memory device decodes the command and selects the signal lines for the data output based on CAS selection, at 824. The CAS selection can be in accordance with any example described.

The memory device retrieves the data and ECC bits and transmits them to the memory controller through the selected data paths, at 826. The selected data paths can provide the ability to have a channel with data and ECC in a memory subsystem where ECC would normally not be applicable. The memory controller receives the data and ECC bits, at 828, and computes the read ECC, at 830. Computing the read ECC can ensure that the read data is correct.

Figure 9:
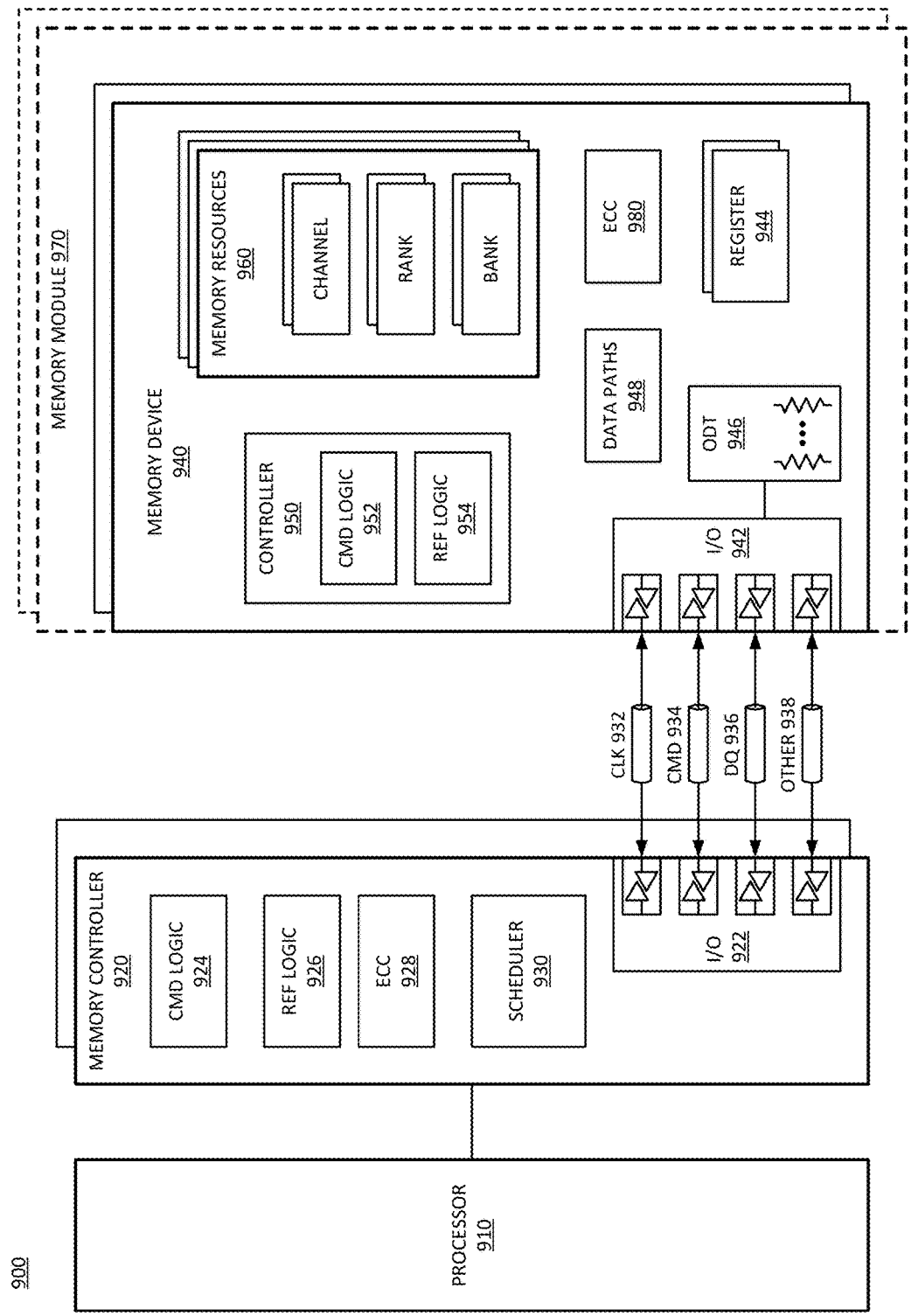
FIG. 9 is a block diagram of an example of a memory subsystem with byte mode memory in which ECC can be implemented.

FIG. 9 is a block diagram of an example of a memory subsystem with byte mode memory in which ECC can be implemented. System 900 includes a processor and elements of a memory subsystem in a computing device. Processor 910 represents a processing unit of a computing platform that may execute an operating system (OS) and applications, which can collectively be referred to as the host or the user of the memory. The OS and applications execute operations that result in memory accesses. Processor 910 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 900 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 920 represents one or more memory controller circuits or devices for system 900. Memory controller 920 represents control logic that generates memory access commands in response to the execution of operations by processor 910. Memory controller 920 accesses one or more memory devices 940. Memory devices 940 can be DRAM devices in accordance with any referred to above. In one example, memory devices 940 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 920 manages a separate memory channel, although system 900 can be configured to have multiple channels managed by a single controller, or to have multiple controllers on a single channel. In one example, memory controller 920 is part of host processor 910, such as logic implemented on the same die or implemented in the same package space as the processor.

Memory controller 920 includes I/O interface logic 922 to couple to a memory bus, such as a memory channel as referred to above. I/O interface logic 922 (as well as I/O interface logic 942 of memory device 940) can include pins, pads, connectors, signal lines, traces, or wires, or other hardware to connect the devices, or a combination of these. I/O interface logic 922 can include a hardware interface. As illustrated, I/O interface logic 922 includes at least drivers/transceivers for signal lines. Commonly, wires within an integrated circuit interface couple with a pad, pin, or connector to interface signal lines or traces or other wires between devices. I/O interface logic 922 can include drivers, receivers, transceivers, or termination, or other circuitry or combinations of circuitry to exchange signals on the signal lines between the devices. The exchange of signals includes at least one of transmit or receive. While shown as coupling I/O 922 from memory controller 920 to I/O 942 of memory device 940, it will be understood that in an implementation of system 900 where groups of memory devices 940 are accessed in parallel, multiple memory devices can include I/O interfaces to the same interface of memory controller 920. In an implementation of system 900 including one or more memory modules 970, I/O 942 can include interface hardware of the memory module in addition to interface hardware on the memory device itself. Other memory controllers 920 will include separate interfaces to other memory devices 940.

The bus between memory controller 920 and memory devices 940 can be implemented as multiple signal lines coupling memory controller 920 to memory devices 940.

The bus may typically include at least clock (CLK) 932, command/address (CMD) 934, and write data (DQ) and read data (DQ) 936, and zero or more other signal lines 938. In one example, a bus or connection between memory controller 920 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 900 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 920 and memory devices 940. An example of a serial bus technology is 8B10B encoding and transmission of high-speed data with embedded clock over a single differential pair of signals in each direction. In one example, CMD 934 represents signal lines shared in parallel with multiple memory devices. In one example, multiple memory devices share encoding command signal lines of CMD 934, and each has a separate chip select (CS_n) signal line to select individual memory devices.

It will be understood that in the example of system 900, the bus between memory controller 920 and memory devices 940 includes a subsidiary command bus CMD 934 and a subsidiary bus to carry the write and read data, DQ 936. In one example, the data bus can include bidirectional lines for read data and for write/command data. In another example, the subsidiary bus DQ 936 can include unidirectional write signal lines for write and data from the host to memory, and can include unidirectional lines for read data from the memory to the host. In accordance with the chosen memory technology and system design, other signals 938 may accompany a bus or sub bus, such as strobe lines DQS. Based on design of system 900, or implementation if a design supports multiple implementations, the data bus can have more or less bandwidth per memory device 940. For example, the data bus can support memory devices that have either a x32 interface, a x16 interface, a x8 interface, or other interface. The convention "xW," where W is an integer that refers to an interface size or width of the interface of memory device 940, which represents a number of signal lines to exchange data with memory controller 920. The interface size of the memory devices is a controlling factor on how many memory devices can be used concurrently per channel in system 900 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 940 and memory controller 920 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 940 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 940 represent memory resources for system 900. In one example, each memory device 940 is a separate memory die. In one example, each memory device 940 can interface with multiple (e.g., 2) channels per device or die. Each memory device 940 includes I/O interface logic 942, which has a bandwidth determined by the implementation of the device (e.g., x16 or x8 or some other interface bandwidth). I/O interface logic 942 enables the memory devices to interface with memory controller 920. I/O interface logic 942 can include a hardware interface, and can be in accordance with I/O 922 of memory controller, but at the memory device end. In one example, multiple memory devices 940 are connected in parallel to the same command and data buses. In another example, multiple memory devices 940 are connected in parallel to the same command bus, and are connected to different data buses. For example, system 900 can be configured with multiple memory devices 940 coupled in parallel, with each memory device responding to a command, and accessing memory resources 960 internal to each. For a Write operation, an individual memory device 940 can write a portion of the overall data word, and for a Read operation, an individual memory device 940 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 940 are disposed directly on a motherboard or host system platform (e.g., a PCB (printed circuit board) on which processor 910 is disposed) of a computing device. In one example, memory devices 940 can be organized into memory modules 970. In one example, memory modules 970 represent dual inline memory modules (DIMMs). In one example, memory modules 970 represent other organization of multiple memory devices to share at least a portion of access or control circuitry, which can be a separate circuit, a separate device, or a separate board from the host system platform. Memory modules 970 can include multiple memory devices 940, and the memory modules can include support for multiple separate channels to the included memory devices disposed on them. In another example, memory devices 940 may be incorporated into the same package as memory controller 920, such as by techniques such as multi-chip-module (MCM), package-on-package, through-silicon via (TSV), or other techniques or combinations. Similarly, in one example, multiple memory devices 940 may be incorporated into memory modules 970, which themselves may be incorporated into the same package as memory controller 920. It will be appreciated that for these and other implementations, memory controller 920 may be part of host processor 910.

Memory devices 940 each include memory resources 960. Memory resources 960 represent individual arrays of memory locations or storage locations for data. Typically memory resources 960 are managed as rows of data, accessed via wordline (rows) and bitline (individual bits within a row) control. Memory resources 960 can be organized as separate channels, ranks, and banks of memory. Channels may refer to independent control paths to storage locations within memory devices 940. Ranks may refer to common locations across multiple memory devices (e.g., same row addresses within different devices). Banks may refer to arrays of memory locations within a memory device 940. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 940 include one or more registers 944. Register 944 represents one or more storage devices or storage locations that provide configuration or settings for the operation of the memory device. In one example, register 944 can provide a storage location for memory device 940 to store data for access by memory controller 920 as part of a control or management operation. In one example, register 944 includes one or more Mode Registers. In one example, register 944 includes one or more multipurpose registers. The configuration of locations within register 944 can configure memory device 940 to operate in different "modes," where command information can trigger different operations within memory device 940 based on the mode. Additionally or in the alternative, different modes can also trigger different operation from address information or other signal lines depending on the mode. Settings of register 944 can indicate configuration for I/O settings (e.g., timing, termination or ODT (on-die termination) 946, driver configuration, or other I/O settings).

In one example, memory device 940 includes ODT 946 as part of the interface hardware associated with I/O 942. ODT 946 can be configured as mentioned above, and provide settings for impedance to be applied to the interface to specified signal lines. In one example, ODT 946 is applied to DQ signal lines. In one example, ODT 946 is applied to command signal lines. In one example, ODT 946 is applied to address signal lines. In one example, ODT 946 can be applied to any combination of the preceding. The ODT settings can be changed based on whether a memory device is a selected target of an access operation or a non-target device. ODT 946 settings can affect the timing and reflections of signaling on the terminated lines. Careful control over ODT 946 can enable higher-speed operation with improved matching of applied impedance and loading. ODT 946 can be applied to specific signal lines of I/O interface 942, 922, and is not necessarily applied to all signal lines.

Memory device 940 includes controller 950, which represents control logic within the memory device to control internal operations within the memory device. For example, controller 950 decodes commands sent by memory controller 920 and generates internal operations to execute or satisfy the commands. Controller 950 can be referred to as an internal controller, and is separate from memory controller 920 of the host. Controller 950 can determine what mode is selected based on register 944, and configure the internal execution of operations for access to memory resources 960 or other operations based on the selected mode. Controller 950 generates control signals to control the routing of bits within memory device 940 to provide a proper interface for the selected mode and direct a command to the proper memory locations or addresses. Controller 950 includes command logic 952, which can decode command encoding received on command and address signal lines. Thus, command logic 952 can be or include a command decoder. With command logic 952, memory device can identify commands and generate internal operations to execute requested commands.

Referring again to memory controller 920, memory controller 920 includes command (CMD) logic 924, which represents logic or circuitry to generate commands to send to memory devices 940. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 940, memory controller 920 can issue commands via I/O 922 to cause memory device 940 to execute the commands. In one example, controller 950 of memory device 940 receives and decodes command and address information received via I/O 942 from memory controller 920. Based on the received command and address information, controller 950 can control the timing of operations of the logic and circuitry within memory device 940 to execute the commands. Controller 950 is responsible for compliance with standards or specifications within memory device 940, such as timing and signaling requirements. Memory controller 920 can implement compliance with standards or specifications by access scheduling and control.

Memory controller 920 includes scheduler 930, which represents logic or circuitry to generate and order transactions to send to memory device 940. From one perspective, the primary function of memory controller 920 could be said to schedule memory access and other transactions to memory device 940. Such scheduling can include generating the transactions themselves to implement the requests for data by processor 910 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 920 typically includes logic such as scheduler 930 to allow selection and ordering of transactions to improve performance of system 900. Thus, memory controller 920 can select which of the outstanding transactions should be sent to memory device 940 in which order, which is typically achieved with logic much more complex that a simple first-in first-out algorithm. Memory controller 920 manages the transmission of the transactions to memory device 940, and manages the timing associated with the transaction. In one example, transactions have deterministic timing, which can be managed by memory controller 920 and used in determining how to schedule the transactions with scheduler 930.

In one example, memory controller 920 includes refresh (REF) logic 926. Refresh logic 926 can be used for memory resources that are volatile and need to be refreshed to retain a deterministic state. In one example, refresh logic 926 indicates a location for refresh, and a type of refresh to perform. Refresh logic 926 can trigger self-refresh within memory device 940, or execute external refreshes which can be referred to as auto refresh commands) by sending refresh commands, or a combination. In one example, system 900 supports all bank refreshes as well as per bank refreshes. All bank refreshes cause the refreshing of banks within all memory devices 940 coupled in parallel. Per bank refreshes cause the refreshing of a specified bank within a specified memory device 940. In one example, controller 950 within memory device 940 includes refresh logic 954 to apply refresh within memory device 940. In one example, refresh logic 954 generates internal operations to perform refresh in accordance with an external refresh received from memory controller 920. Refresh logic 954 can determine if a refresh is directed to memory device 940, and what memory resources 960 to refresh in response to the command.

In one example, memory controller 920 includes error checking and correction logic (ECC) 970 to perform system-level ECC for system 900. System-level ECC refers to application of error correction at memory controller 920, and can apply error correction to data bits from multiple different memory devices 940. ECC 970 represents circuitry or logic to enable system-level ECC operations, such as double bit error correction.

In one example, memory device 940 includes internal ECC 980, which can also be referred to as on-die ECC. In one example, internal ECC 980 represents SEC ECC logic within memory device 940. In one example, ECC 980 operates on internal ECC code 982, which represents a code matrix having quadrant based codes to steer aliasing. The code prevents aliasing to a quadrant adjacent to a quadrant where an error was detected, in accordance with any example herein.

I/O 942 can represent the I/O connectors of memory device 940 to interface with processor 910 and memory controller 920. In one example, memory resources 960 of memory devices 940 include banks divided into subarrays. The subarrays can alternatively be referred to simply as arrays. The subarrays refer to sections of the memory, such as a group of rows of memory cells. Data paths 948 represent the routing of wires and connecting devices to transfer data signals between the subarrays and I/O 942. In one example, data paths 948 include selection logic to enable the selection of specific portions of the memory array to I/O 942. Data paths 948 can enable the application of ECC within a device that typically includes a binary interface size. The selection of data paths 948 can be in accordance with any example described.

In one example, memory controller includes ECC manager 928 to manage error checking and correction in memory accesses of system 900. ECC manager 928 of memory controller 920 manages system wide ECC, and can detect and correct errors across multiple different memory resources in parallel (e.g., multiple memory devices 940). Many techniques for system wide ECC are known, and can include ECC manager 928 managing memory resources in a way to spread errors across multiple resources. By spreading errors across multiple resources, memory controller 920 can recover data even in the event of one or more failures in memory device 940. Memory failures are generally categorized as either soft errors or soft failures, which are transient bit errors typically resulting from random environmental conditions, or hard errors or hard failures, which are non-transient bit errors occurring as a result of a hardware failure.

In one example, memory controller 920 can provide extra system bits to memory device 940, and the same extra bits can be returned by the memory device in response to a read request. In one example, memory device 940 transfers data in bursts, where a burst is a sequence of transfer cycles. A transfer cycle refers to a period of time based on a clock or timing signal. The transfer cycle can be referred to as a unit interval (UI). Memory transfers commonly occur over the DQ signal lines over a burst of N UIs, such a 16 cycle or 16 UI burst length or burst length of 16 (BL16), or an 8 UI burst length (BL8). Thus, a memory subsystem provide data on certain DQ signal lines during a BL16, and concurrently provide ECC data for the transferred data bits on different DQ signal lines. As described herein, data paths 948 can enable memory device 940 to selectively use DQ signal lines for data or ECC bits, in accordance with a system configuration. In one example, register 944 includes a mode register setting or other register field or configuration that configures the memory device to operate in an ECC mode, where at least a portion of memory resources 960 is not utilized, and data paths 948 provide an ECC I/O interface of a non-binary number to provide ECC bits for a binary number of data signal lines.

Figure 10:
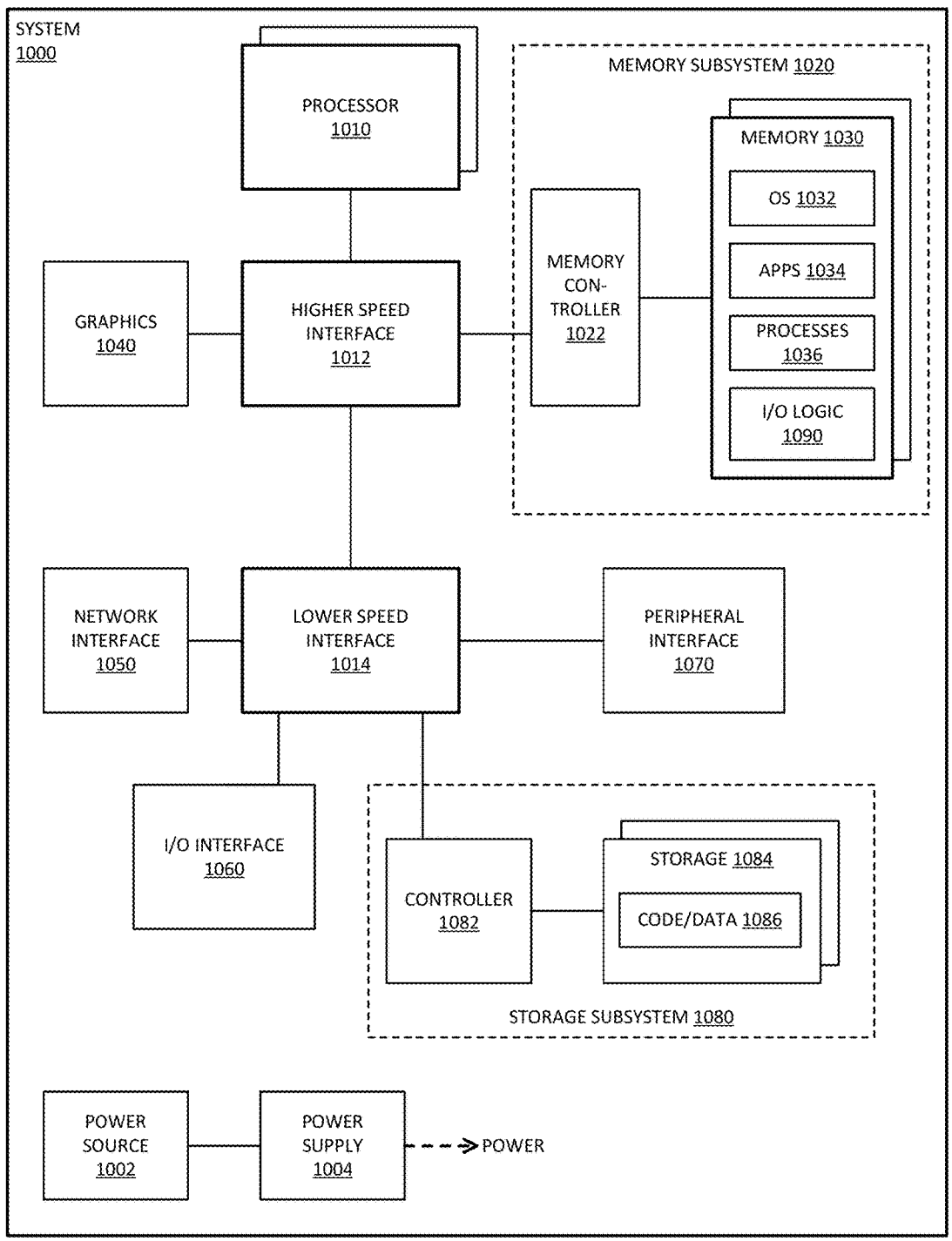
FIG. 10 is a block diagram of an example of a computing system in which a low power memory device can be implemented in byte mode with ECC.

FIG. 10 is a block diagram of an example of a computing system in which a low power memory device can be implemented in byte mode with ECC. System 1000 represents a computing device in accordance with any example herein, and can be a laptop computer, a desktop computer, a tablet computer, a server, a gaming or entertainment control system, embedded computing device, or other electronic device.

In one example, memory 1030 includes I/O logic 1090. Logic 1090 can include logic in a data path in accordance with any example described herein, to select data paths in accordance with CAS selection. Logic 1090 enables data paths to selectively couple to external connections for use in exchanging ECC data. In one example, logic 1090 is used in connection with a byte mode configuration for memory 1030. In one example, logic 1090 includes a remapping of I/O to use a portion of the interface as ECC, and to block an unused portion of the interface. In one example, logic 1090 includes logic to enable multiple columns to selectively connect to an I/O connector, and to block an unused portion of the interface.

In one example, memory 1032 is a DRAM. In one example, processor 1020 represents one or more processors that execute data stored in one or more DRAM memories 1032. In one example, network interface 1050 exchanges data with another device in another network location, and the data is data stored in memory 1032. In one example, system 1000 includes ECC logic 1080 to perform internal ECC within a memory, and thus ECC logic 1080 could be at least partially represented within memory 1032. ECC logic 1080 can also represent system-wide ECC at memory controller 1034, which uses the fact that memory 1032 performs internal ECC to provide more robust ECC for system 1000. ECC logic 1080 with respect to internal ECC in memory 1032 includes a code matrix in accordance with any example described herein. Thus, ECC logic 1080 operates in accordance with a code matrix treated as separate quadrants or segments, which can steer aliasing. The code prevents aliasing to a quadrant adjacent to a quadrant where an error was detected, in accordance with any example herein.

In one example, system 1000 includes power management 1090 to provide power to system 1000. In one example, power management 1090 includes power control logic to provide gating control and reset control to core circuitry including processor 1010 and interface 1012. The power control logic also provides gating and reset control to memory controller 1022 and the interfaces for memory 1030. In one example, system 1000 also includes test power control 1092, which can be test control in accordance with an example herein. Test power control 1092 provides selective enabling of memory I/O for platform testing of a platform in which system 1000 is incorporated.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1002 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
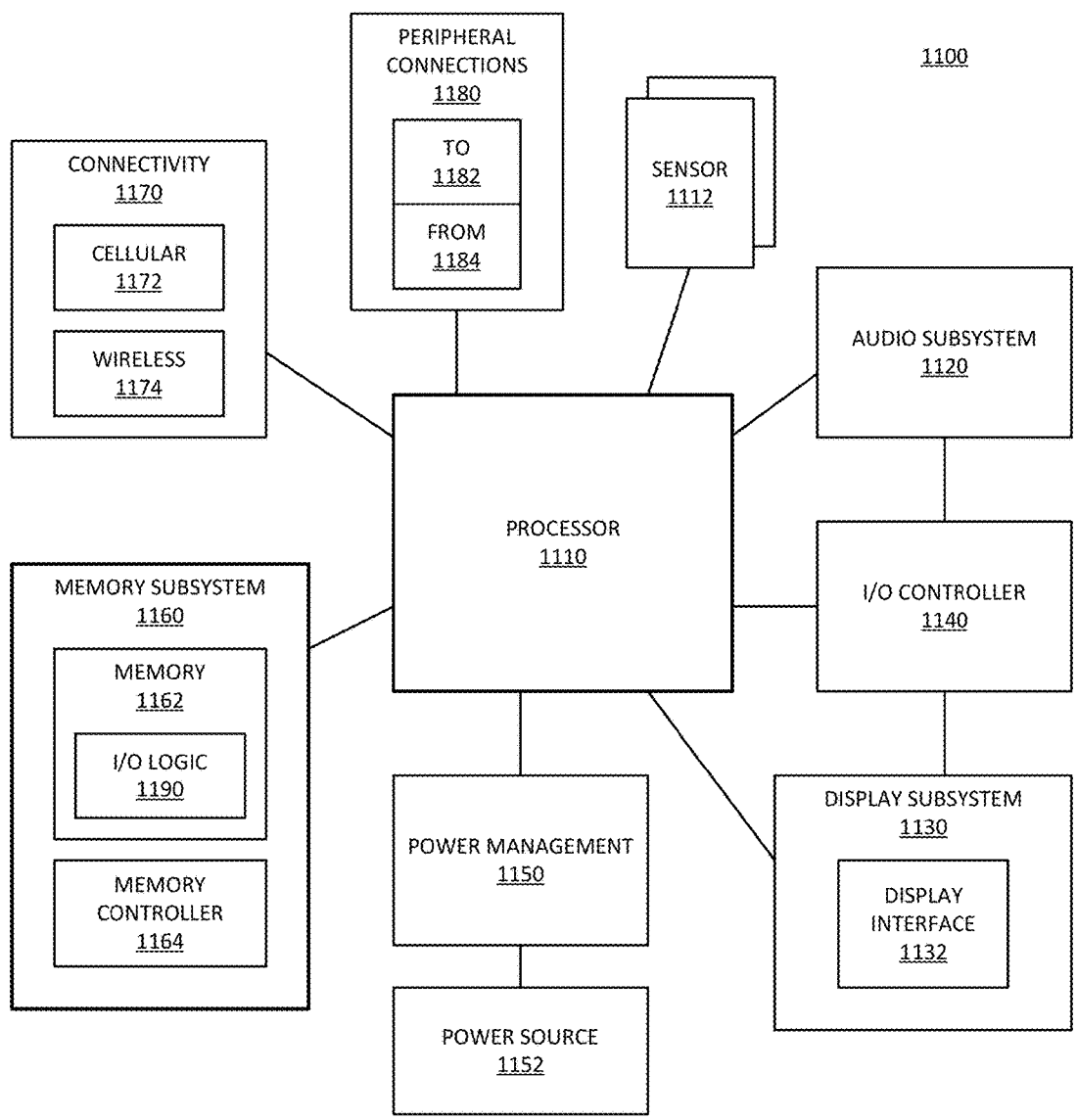
FIG. 11 is a block diagram of an example of a mobile device in which a low power memory device can be implemented in byte mode with ECC.

FIG. 11 is a block diagram of an example of a mobile device in which a low power memory device can be implemented in byte mode with ECC. Device 1100 represents a mobile computing device, such as a computing tablet, a mobile phone or smartphone, wearable computing device, or other mobile device, or an embedded computing device. It will be understood that certain of the components are shown generally, and not all components of such a device are shown in device 1100.

In one example, memory 1162 includes I/O logic 1190. Logic 1190 can include logic in a data path in accordance with any example described herein, to select data paths in accordance with CAS selection. Logic 1190 enables data paths to selectively couple to external connections for use in exchanging ECC data. In one example, logic 1190 is used in connection with a byte mode configuration for memory 1162. In one example, logic 1190 includes a remapping of I/O to use a portion of the interface as ECC, and to block an unused portion of the interface. In one example, logic 1190 includes logic to enable multiple columns to selectively connect to an I/O connector, and to block an unused portion of the interface.

In one example, memory 1162 is a DRAM. In one example, processor 1110 represents one or more processors that execute data stored in one or more DRAM memories 1162. In one example, connectivity 1170 includes a network interface to exchange data with another device in another network location, and the data is data stored in memory 1162. In one example, system 1100 includes ECC logic 1190 to perform internal ECC within a memory, and thus ECC logic 1190 could be at least partially represented within memory 1162. ECC logic 1190 can also represent system-wide ECC at memory controller 1164, which uses the fact that memory 1162 performs internal ECC to provide more robust ECC for system 1100. ECC logic 1190 with respect to internal ECC in memory 1162 includes a code matrix in accordance with any example described herein. Thus, ECC logic 1190 operates in accordance with a code matrix that can be operated in multiple segment corresponding to multiple segments of the data words for read and write operations. Thus, ECC logic 1190 operates in accordance with a code matrix treated as separate quadrants or segments, which can steer aliasing. The code prevents aliasing to a quadrant adjacent to a quadrant where an error was detected, in accordance with any example herein.

In one example, system 1100 includes power management 1150 to provide power to system 1100. While shown connected to processor 1110, power management 1150 provides power for the other components of system 1100 as well, but can be managed by processor 1110. In one example, power management 1150 includes power control logic to provide gating control and reset control to core circuitry including processor 1110 and its interfaces to the other components. The power control logic also provides gating and reset control to memory controller 1164 and the interfaces for memory 1162. In one example, system 1100 also includes memory I/O test power control logic 1190, which can be test control in accordance with an example herein. Memory I/O test logic 1190 provides selective enabling of memory I/O for platform testing of a platform in which system 1100 is incorporated.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting device 1100 to another device, or a combination. The processing operations can also include operations related to audio I/O, display I/O, or other interfacing, or a combination. Processor 1110 can execute data stored in memory. Processor 1110 can write or edit data stored in memory.

In one example, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one example, one or more sensors 1112 couples to processor 1110 via a frontend circuit integrated with processor 1110. In one example, one or more sensors 1112 couples to processor 1110 via another component of system 1100.

In one example, device 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1100, or connected to device 1100. In one example, a user interacts with device 1100 by providing audio commands that are received and processed by processor 1110.

Display subsystem 1130 represents hardware (e.g., display devices) and software components (e.g., drivers) that provide a visual display for presentation to a user. In one example, the display includes tactile components or touchscreen elements for a user to interact with the computing device. Display subsystem 1130 includes display interface 1132, which includes the particular screen or hardware device used to provide a display to a user. In one example, display interface 1132 includes logic separate from processor 1110 (such as a graphics processor) to perform at least some processing related to the display. In one example, display subsystem 1130 includes a touchscreen device that provides both output and input to a user. In one example, display subsystem 1130 includes a high definition (HD) or ultra-high definition (UHD) display that provides an output to a user. In one example, display subsystem includes or drives a touchscreen display. In one example, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one example, I/O controller 1140 manages devices such as accelerometers, cameras, light sensors or other environmental sensors, gyroscopes, global positioning system (GPS), or other hardware that can be included in device 1100, or sensors 1112. The input can be part of direct user interaction, as well as providing environmental input to the system to influence its operations (such as filtering for noise, adjusting displays for brightness detection, applying a flash for a camera, or other features).

In one example, device 1100 includes power management 1150 that manages battery power usage, charging of the battery, and features related to power saving operation. Power management 1150 manages power from power source 1152, which provides power to the components of system 1100. In one example, power source 1152 includes an AC to DC (alternating current to direct current) adapter to plug into a wall outlet. Such AC power can be renewable energy (e.g., solar power, motion based power). In one example, power source 1152 includes only DC power, which can be provided by a DC power source, such as an external AC to DC converter. In one example, power source 1152 includes wireless charging hardware to charge via proximity to a charging field. In one example, power source 1152 can include an internal battery or fuel cell source.

Memory subsystem 1160 includes memory device(s) 1162 for storing information in device 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one example, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable device 1100 to communicate with external devices. The external device could be separate devices, such as other computing devices, wireless access points or base stations, as well as peripherals such as headsets, printers, or other devices. In one example, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading, uploading, changing, synchronizing) content on device 1100. Additionally, a docking connector can allow device 1100 to connect to certain peripherals that allow device 1100 to control content output, for example, to audiovisual or other systems.

In one example, a memory device package includes: an input/output (I/O) interface having N connectors to couple to a channel having fewer than N signal lines; a first memory die with a first N-bit interface; a second memory die with a second N-bit interface; and circuitry to selectively apply column address select (CAS) signals to the first and second memory dies to selectively couple N/2 interface bits of the first memory die to N/2 of the N connectors and at least one of the interface bits of the second memory die to at least one of the N connectors, to provide a channel having fewer than N bits spread between the first and second memory dies, the channel to include N/2 data (DQ) signal lines and at least one error checking and correction (ECC) signal line.

In one example, the first and second dies are to operate in byte mode to apply only N/2 bits each of their respective N-bit interfaces. In one example, the circuitry includes gating logic to selectively disable unused connectors of the N signal lines of the I/O interface. In one example, the circuitry includes multiplexing circuitry to select interface bits of the first and second memory dies to be accessed. In one example, the multiplexing circuitry includes a multiplexer to select (N/2)+1 bits of the first and second memory dies for N/2 DQ signal lines and an ECC signal line, based on a column address select (CAS) signal. In one example, the multiplexer is to multiplex among global I/O signal lines that connect the I/O interface to the first and second memory dies to select the (N/2)+1 bits. In one example, the multiplexer is to multiplex among CAS signal lines of a command and address bus shared between the first and second memory dies to select the (N/2)+1 bits. In one example, the first and second dies comprise low power double data rate (LPDDR) memory chips. In one example, N=16, with eight data (DQ) signal lines and one ECC signal line. In one example, the circuitry is to select among 3 combinations of eight DQ bits and one ECC bit each from the 32 interface bits of the first and second memory dies, wherein the first memory die includes two groups of eight DQ bits and the second memory die includes one group of eight DQ bits and ECC bits for each of the 3 groups of eight DQ bits.

In one example, a system with a memory subsystem includes: a memory controller; and a multi-device package coupled to the memory controller, the multi-device package including an input/output (I/O) interface having N connectors to couple to a channel having fewer than N signal lines; a first memory die with a first N-bit interface; a second memory die with a second N-bit interface; and circuitry to selectively apply column address select (CAS) signals to the first and second memory dies to selectively couple N/2 interface bits of the first memory die to N/2 of the N connectors and at least one of the interface bits of the second memory die to at least one of the N connectors, to provide a channel having fewer than N bits spread between the first and second memory dies, the channel to include N/2 data (DQ) signal lines and at least one error checking and correction (ECC) signal line. In one example, the first and second dies are to operate in byte mode to apply only N/2 bits each of their respective N-bit interfaces. In one example, the circuitry includes gating logic to selectively disable unused connectors of the N signal lines of the I/O interface. In one example, the circuitry includes multiplexing circuitry to select interface bits of the first and second memory dies to be accessed. In one example, the multiplexing circuitry includes a multiplexer to select (N/2)+1 bits of the first and second memory dies for N/2 DQ signal lines and an ECC signal line, based on a column address select (CAS) signal. In one example, the multiplexer is to multiplex among global I/O signal lines that connect the I/O interface to the first and second memory dies to select the (N/2)+1 bits. In one example, the multiplexer is to multiplex among CAS signal lines of a command and address bus shared between the first and second memory dies to select the (N/2)+1 bits. In one example, the first and second dies comprise low power double data rate (LPDDR) memory chips. In one example, N=16, with eight data (DQ) signal lines and one ECC signal line. In one example, the circuitry is to select among 3 combinations of eight DQ bits and one ECC bit each from the 32 interface bits of the first and second memory dies, wherein the first memory die includes two groups of eight DQ bits and the second memory die includes one group of eight DQ bits and ECC bits for each of the 3 groups of eight DQ bits. In one example, the system further comprising one or more of: a multicore processor coupled to the memory controller, at least one core of the processor to execute data stored in the DRAM devices; a network adapter coupled to exchange data between the DRAM devices and a remote network location; or a display communicatively coupled to a multicore processor.

In one example, a method includes: a memory controller; and a multi-device package coupled to the memory controller, the multi-device package including an input/output (I/O) interface having N connectors to couple to a channel having fewer than N signal lines; a first memory die with a first N-bit interface; a second memory die with a second N-bit interface; and circuitry to selectively apply column address select (CAS) signals to the first and second memory dies to selectively couple N/2 interface bits of the first memory die to N/2 of the N connectors and at least one of the interface bits of the second memory die to at least one of the N connectors, to provide a channel having fewer than N bits spread between the first and second memory dies, the channel to include N/2 data (DQ) signal lines and at least one error checking and correction (ECC) signal line.

In one example, a method includes: selectively applying column address select (CAS) signals to first and second memory dies to selectively couple N/2 interface bits of the first memory die to N/2 of N connectors, in a memory package having an input/output (I/O) interface with N connectors to couple to a channel having fewer than N signal lines; and selectively coupling interface bits of the second memory die to at least one of the N connectors, to provide a channel having fewer than N bits spread between the first and second memory dies, the channel to include N/2 data (DQ) signal lines and at least one error checking and correction (ECC) signal line. In one example, the first and second dies are to operate in byte mode to apply only N/2 bits each of their respective N-bit interfaces. In one example, selectively coupling includes selectively disabling unused connectors of the N signal lines of the I/O interface. In one example, selectively coupling includes multiplexing to select interface bits of the first and second memory dies to be accessed. In one example, multiplexing includes selecting (N/2)+1 bits of the first and second memory dies for N/2 DQ signal lines and an ECC signal line, based on a column address select (CAS) signal. In one example, multiplexing includes multiplexing among global I/O signal lines that connect the I/O interface to the first and second memory dies to select the (N/2)+1 bits. In one example, multiplexing includes multiplexing among CAS signal lines of a command and address bus shared between the first and second memory dies to select the (N/2)+1 bits. In one example, the first and second dies comprise low power double data rate (LPDDR) memory chips. In one example, N=16, with eight data (DQ) signal lines and one ECC signal line. In one example, including selecting among 3 combinations of eight DQ bits and one ECC bit each from the 32 interface bits of the first and second memory dies, wherein the first memory die includes two groups of eight DQ bits and the second memory die includes one group of eight DQ bits and ECC bits for each of the 3 groups of eight DQ bits.

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware and/or software. Although shown in a particular sequence or order, unless otherwise specified, the order of the actions can be modified. Thus, the illustrated examples should be understood only as an example, and the process can be performed in a different order, and some actions can be performed in parallel. Additionally, one or more actions can be omitted in various examples; thus, not all actions are required in every example. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the examples described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed examples and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device package, comprising:
   an input/output (I/O) interface having N connectors to couple to a channel having fewer than N signal lines;
   a first memory die with a first N-bit interface;
   a second memory die with a second N-bit interface; and
   circuitry to selectively apply column address select (CAS) signals to the first and second memory dies to selectively couple N/2 interface bits of the first memory die to N/2 of the N connectors and at least one of the interface bits of the second memory die to at least one of the N connectors, to provide a channel having fewer than N bits spread between the first and second memory dies, the channel to include N/2 data (DQ) signal lines and at least one error checking and correction (ECC) signal line.

2. The memory device package of claim 1, wherein the first and second dies are to operate in byte mode to apply only N/2 bits each of their respective N-bit interfaces.

3. The memory device package of claim 1, wherein the circuitry includes gating logic to selectively disable unused connectors of the N signal lines of the I/O interface.

4. The memory device package of claim 1, wherein the circuitry includes multiplexing circuitry to select interface bits of the first and second memory dies to be accessed.

5. The memory device package of claim 4, wherein the multiplexing circuitry includes a multiplexer to select (N/2)+1 bits of the first and second memory dies for N/2 DQ signal lines and an ECC signal line, based on a column address select (CAS) signal.

6. The memory device package of claim 5, wherein the multiplexer is to multiplex among global I/O signal lines that connect the I/O interface to the first and second memory dies to select the (N/2)+1 bits.

7. The memory device package of claim 5, wherein the multiplexer is to multiplex among CAS signal lines of a command and address bus shared between the first and second memory dies to select the (N/2)+1 bits.

8. The memory device package of claim 1, wherein the first and second dies comprise low power double data rate (LPDDR) memory chips.

9. The memory device package of claim 1, wherein N=16, with eight data (DQ) signal lines and one ECC signal line.

10. The memory device package of claim 9, wherein the circuitry is to select among 3 combinations of eight DQ bits and one ECC bit each from the 32 interface bits of the first and second memory dies, wherein the first memory die includes two groups of eight DQ bits and the second memory die includes one group of eight DQ bits and ECC bits for each of the 3 groups of eight DQ bits.

11. A system with a memory subsystem, comprising:
    a memory controller; and
    a multi-device package coupled to the memory controller, the multi-device package including
      an input/output (I/O) interface having N connectors to couple to a channel having fewer than N signal lines;
      a first memory die with a first N-bit interface;
      a second memory die with a second N-bit interface; and
      circuitry to selectively apply column address select (CAS) signals to the first and second memory dies to selectively couple N/2 interface bits of the first memory die to N/2 of the N connectors and at least one of the interface bits of the second memory die to at least one of the N connectors, to provide a channel having fewer than N bits spread between the first and second memory dies, the channel to include N/2 data (DQ) signal lines and at least one error checking and correction (ECC) signal line.

12. The system of claim 11, wherein the first and second dies are to operate in byte mode to apply only N/2 bits each of their respective N-bit interfaces.

13. The system of claim 11, wherein the circuitry includes gating logic to selectively disable unused connectors of the N signal lines of the I/O interface.

14. The system of claim 11, wherein the circuitry includes multiplexing circuitry to select interface bits of the first and second memory dies to be accessed.

15. The system of claim 14, wherein the multiplexing circuitry includes a multiplexer to select (N/2)+1 bits of the first and second memory dies for N/2 DQ signal lines and an ECC signal line, based on a column address select (CAS) signal.

16. The system of claim 15, wherein the multiplexer is to multiplex among global I/O signal lines that connect the I/O interface to the first and second memory dies to select the (N/2)+1 bits.

17. The system of claim 15, wherein the multiplexer is to multiplex among CAS signal lines of a command and address bus shared between the first and second memory dies to select the (N/2)+1 bits.

18. The system of claim 11, wherein the first and second dies comprise low power double data rate (LPDDR) memory chips.

19. The system of claim 11, wherein N=16, with eight data (DQ) signal lines and one ECC signal line.

20. The system of claim 19, wherein the circuitry is to select among 3 combinations of eight DQ bits and one ECC bit each from the 32 interface bits of the first and second memory dies, wherein the first memory die includes two groups of eight DQ bits and the second memory die includes one group of eight DQ bits and ECC bits for each of the 3 groups of eight DQ bits.

21. The system of claim 11, further comprising one or more of:
- a multicore processor coupled to the memory controller, at least one core of the processor to execute data stored in the multi-device package;
- a network adapter coupled to exchange data between the multi-device package and a remote network location; or
- a display communicatively coupled to a multicore processor.

* * * * *